US010870771B2

(12) United States Patent
Swisher et al.

(10) Patent No.: US 10,870,771 B2
(45) Date of Patent: Dec. 22, 2020

(54) NON-AQUEOUS INK COMPOSITIONS CONTAINING TRANSITION METAL COMPLEXES, AND USES THEREOF IN ORGANIC ELECTRONICS

(71) Applicant: NISSAN CHEMICAL INDUSTRIES, LTD., Tokyo (JP)

(72) Inventors: Robert Swisher, Pittsburgh, PA (US); Elena Sheina, Pittsburgh, PA (US); Sergey B. Li, Glenshaw, PA (US); Marc Sims, Pittsburgh, PA (US)

(73) Assignee: Nissan Chemical industries, Ltd., Tokyo (JP)

( * ) Notice: Subject to any disclaimer, the term of this patent is extended or adjusted under 35 U.S.C. 154(b) by 0 days.

(21) Appl. No.: 16/070,038

(22) PCT Filed: Jan. 20, 2017

(86) PCT No.: PCT/JP2017/001975
§ 371 (c)(1),
(2) Date: Jul. 13, 2018

(87) PCT Pub. No.: WO2017/126677
PCT Pub. Date: Jul. 27, 2017

(65) Prior Publication Data

US 2019/0023930 A1 Jan. 24, 2019

Related U.S. Application Data

(60) Provisional application No. 62/280,759, filed on Jan. 20, 2016.

(51) Int. Cl.
*C09D 11/52* (2014.01)
*C09D 11/102* (2014.01)
(Continued)

(52) U.S. Cl.
CPC ............ *C09D 11/52* (2013.01); *C09D 11/033* (2013.01); *C09D 11/102* (2013.01); *C09D 11/36* (2013.01);
(Continued)

(58) Field of Classification Search
None
See application file for complete search history.

(56) References Cited

U.S. PATENT DOCUMENTS 4,356,429 A 10/1982 Tang
4,539,507 A 9/1985 VanSlyke et al.
(Continued)

FOREIGN PATENT DOCUMENTS

WO WO 2008/073149 A2 6/2008
WO WO 2010/127253 A1 11/2010

OTHER PUBLICATIONS

International Search Report and Written Opinion received in connection with international application No. PCT/JP2017/001975; dated Feb. 21, 2017.
(Continued)

*Primary Examiner* — Katie L. Hammer
(74) *Attorney, Agent, or Firm* — The Marbury Law Group. PLLC

(57) ABSTRACT

Described herein are non-aqueous ink compositions containing a polythiophene having a repeating unit complying with formula (I) described herein, a transition metal complex having at least one β-diketonate ligand, and a liquid carrier having one or more organic solvents. The present disclosure also concerns the uses of such non-aqueous ink compositions, for example, in organic electronic devices.

20 Claims, 3 Drawing Sheets

(51) Int. Cl.

| | |
|---|---|
| ***C09D 11/033*** | (2014.01) |
| ***C09D 11/36*** | (2014.01) |
| ***C09D 11/38*** | (2014.01) |
| ***H01L 51/00*** | (2006.01) |
| ***H01L 51/50*** | (2006.01) |
| *C07F 11/00* | (2006.01) |

(52) U.S. Cl.

CPC .......... *C09D 11/38* (2013.01); *H01L 51/0007* (2013.01); *H01L 51/0036* (2013.01); *H01L 51/50* (2013.01); *C07F 11/00* (2013.01); *H01L 51/506* (2013.01); *H01L 51/5088* (2013.01); *Y02E 10/549* (2013.01)

(56) References Cited

U.S. PATENT DOCUMENTS

| | | | | |
|---|---|---|---|---|
| 5,047,687 | A | 9/1991 | VanSlyke | |
| 5,247,190 | A | 9/1993 | Friend et al. | |
| 5,401,827 | A | 3/1995 | Holmes et al. | |
| 5,454,880 | A | 10/1995 | Sariciftci et al. | |
| 6,166,172 | A | 12/2000 | McCullough et al. | |
| 6,602,974 | B1 | 8/2003 | McCullough et al. | |
| 6,812,399 | B2 | 11/2004 | Shaheen et al. | |
| 6,933,436 | B2 | 8/2005 | Shaheen et al. | |
| 7,070,867 | B2 | 7/2006 | Thompson et al. | |
| 7,252,570 | B2 * | 8/2007 | Takashima | C09K 11/06 313/504 |
| 8,017,241 | B2 | 9/2011 | Seshadri et al. | |
| 8,865,025 | B2 | 10/2014 | Seshadri et al. | |
| 2004/0113127 | A1 | 6/2004 | Min et al. | |
| 2005/0123793 | A1 | 6/2005 | Thompson et al. | |
| 2006/0175582 | A1 | 8/2006 | Hammond et al. | |
| 2009/0256117 | A1 * | 10/2009 | Seshadri | C08G 61/126 252/500 |
| 2010/0108954 | A1 | 5/2010 | Benson-Smith et al. | |
| 2010/0109000 | A1 | 5/2010 | Mathai et al. | |
| 2010/0292399 | A1 | 11/2010 | Brown et al. | |
| 2011/0089410 | A1 * | 4/2011 | Stoessel | C08G 79/00 257/40 |
| 2012/0256137 | A1 * | 10/2012 | James | H01L 51/0003 252/500 |
| 2013/0026415 | A1 * | 1/2013 | James | H01L 51/0005 252/301.16 |
| 2014/0231795 | A1 * | 8/2014 | Otsuki | C09D 11/037 257/40 |

OTHER PUBLICATIONS

Erdoenmez et al., "Power-law conductivity in polythiophene/copper(II) acetylacetonate composites", Polymer Int. (2014) vol. 63, pp. 31-36.

Kellerman et al., "Low-cost copper complexes as p-dopants in solution processable hole transport layers", Applied Phys. Lett., 107, 103305 (2015).

Kraft et al., "Electroluminescent Conjugated Polymers—Seeing Polymers in a New Light," Angew. Chem. Int. Ed., (1998), 37, 402-428.

Lebedev et al., "Salvato-Controlled Doping of Conducting Polymers", Chem. Mater., (1998), 10, pp. 156-163.

Lee, Yun-Ju et al., "Low-Temperature Solution-Processed Molybdenum Oxide Nanoparticle Hole Transport Layers for Organic Photovoltaic Devices", Adv. Energy Mater., (2012), 2, 1193-1197.

Lee, Wonmok et al.,"Synthesis of Ni/NiO core shell nanoparticles for wet-coated hole transport layer of the organic solar cell", Surface & Coating Technology, 231, (2013) 93-97.

Extended European Search Report received in connection to European Patent Application No. 17741554.4, dated Aug. 20, 2019.

* cited by examiner

[Fig. 1]
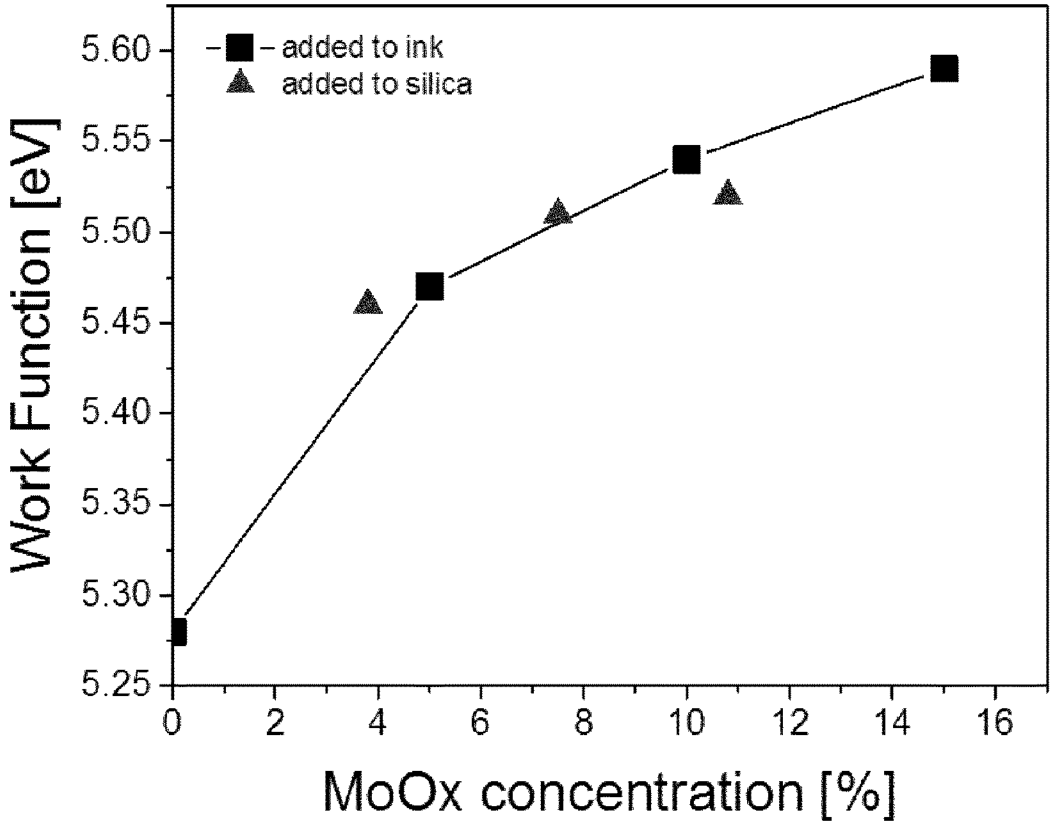
[Fig. 2]
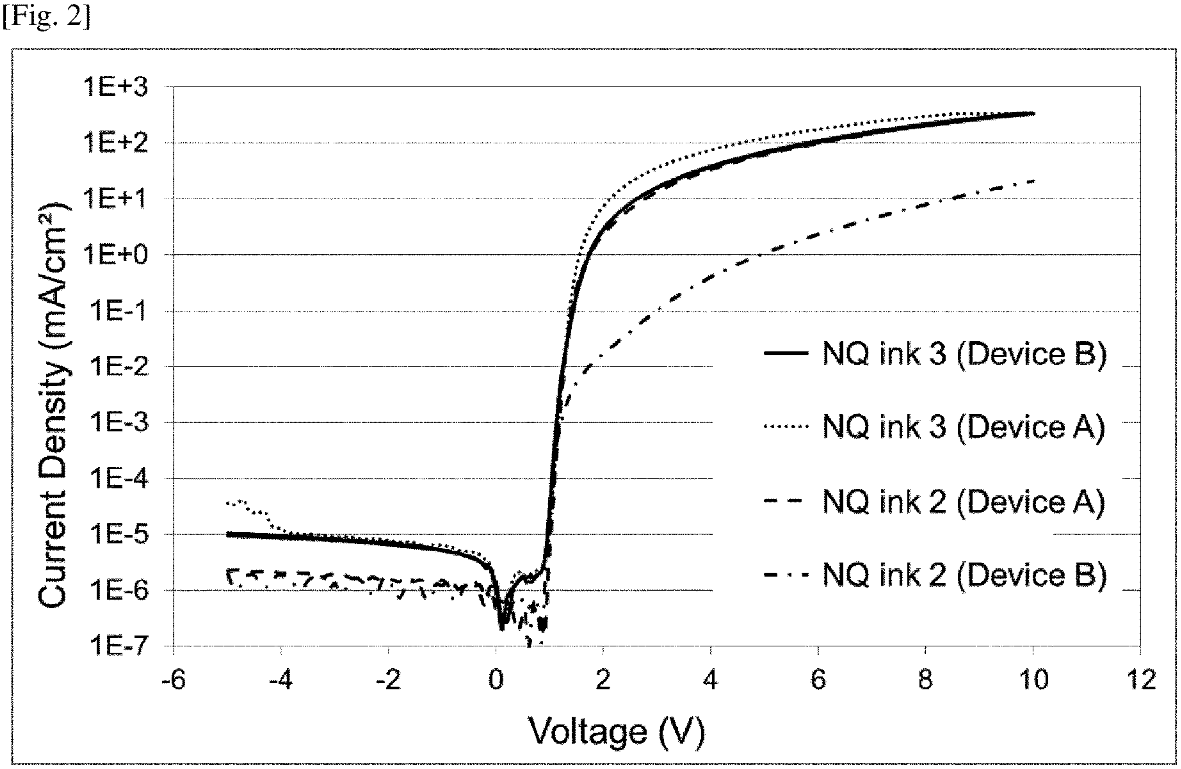

[Fig. 3]
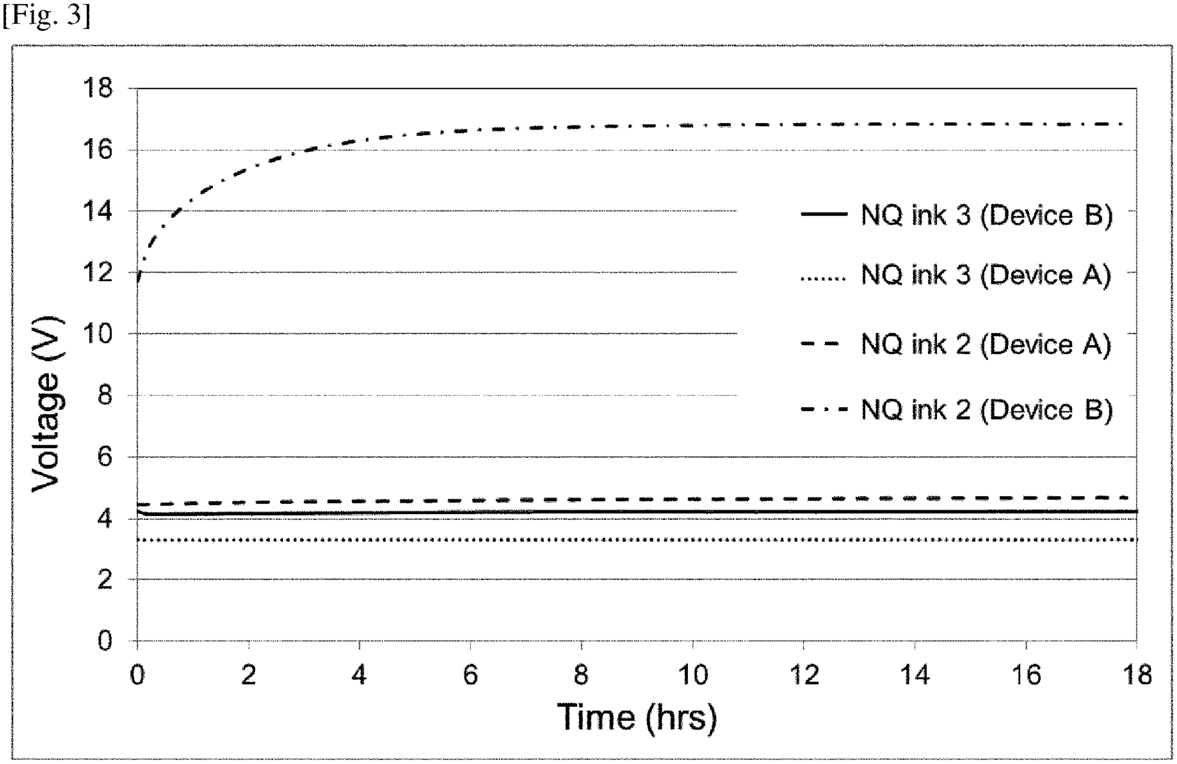
[Fig. 4]
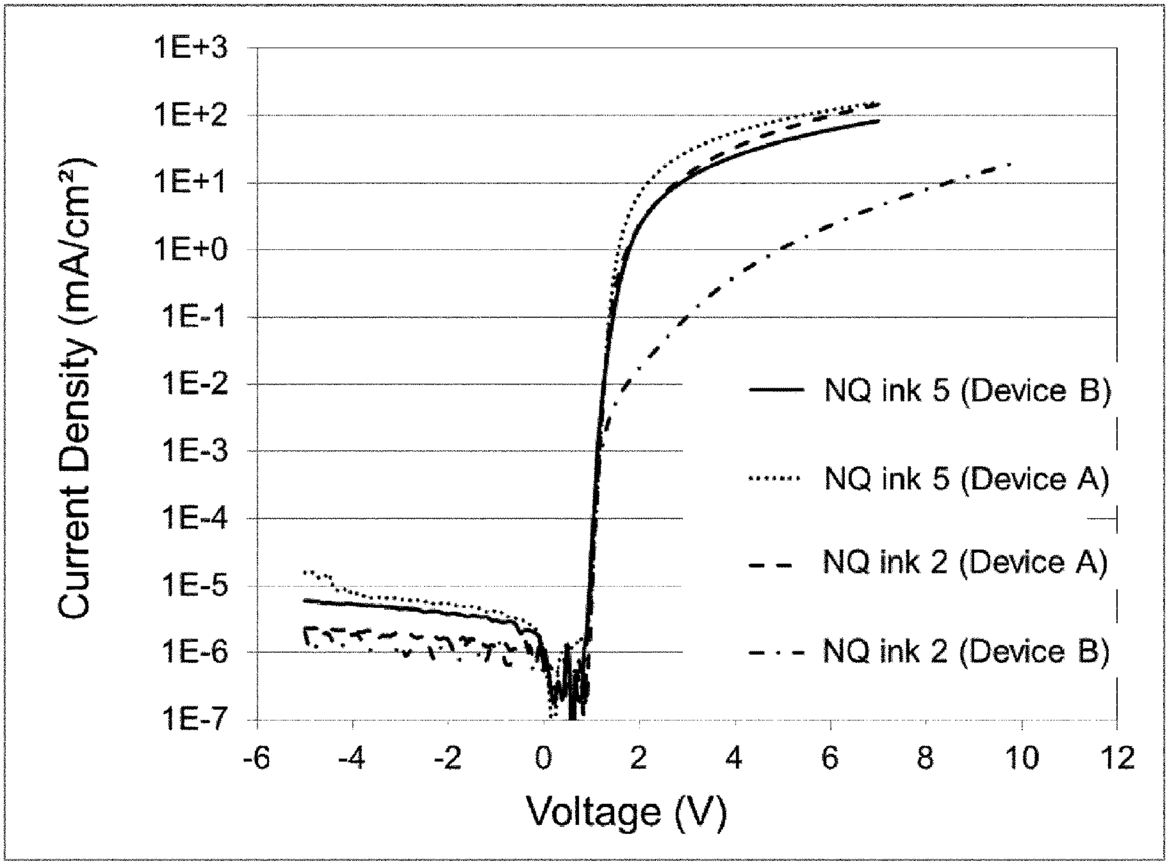

[Fig. 5]
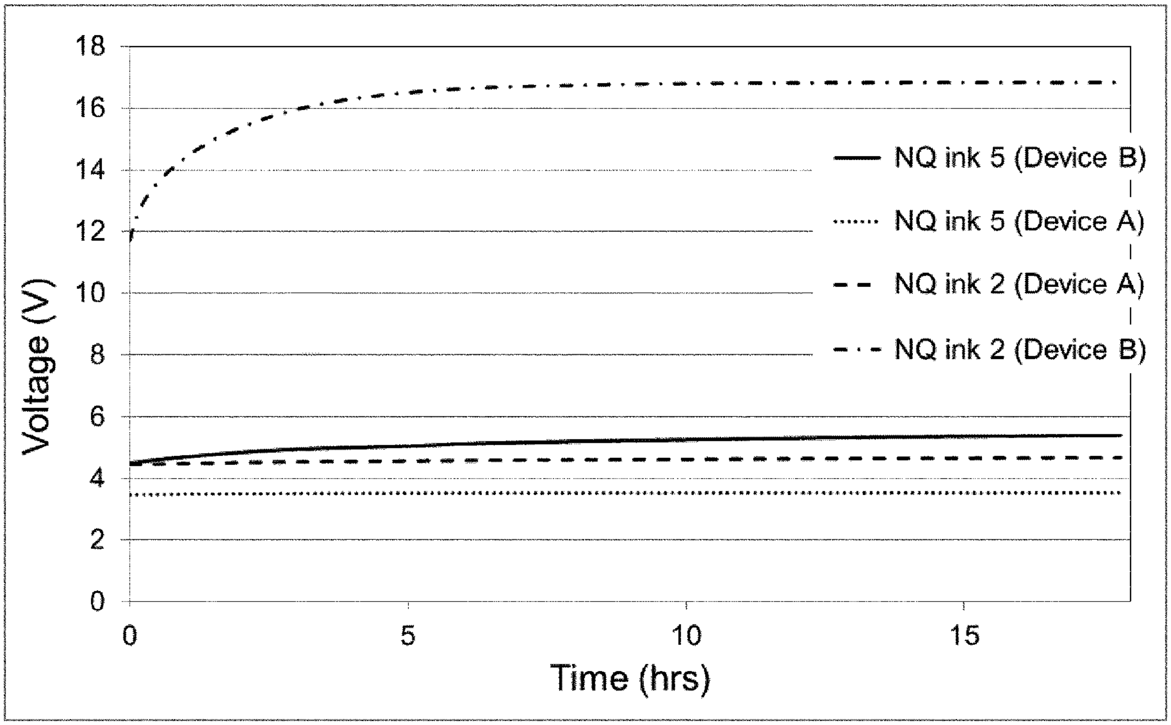

NON-AQUEOUS INK COMPOSITIONS CONTAINING TRANSITION METAL COMPLEXES, AND USES THEREOF IN ORGANIC ELECTRONICS

RELATED APPLICATIONS

This application is a national phase of International Application No. PCT/JP2017/001975, filed Jan. 20, 2017, which claims benefit of priority to U.S. Provisional application 62/280,759 filed Jan. 20, 2016, the disclosures of which are incorporated herein by reference in their entireties.

TECHNICAL FIELD

The present disclosure relates to a non-aqueous ink composition comprising a polythiophene polymer and a transition metal complex having at least one β-diketonate ligand, and uses thereof, for example, in organic electronic devices.

BACKGROUND ART

Although useful advances are being made in energy saving devices such as, for example, organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better materials processing and/or device performance for commercialization.

High efficiency OLEDs usually comprise a multiplicity of different layers, each layer being optimized towards achieving the optimum efficiency of the overall device. Typically, such OLEDs comprise a multilayer structure comprising multiple layers serving different purposes. The typical OLED device stack comprises an anode, a hole transport layer (HTL), an emissive layer (EML), an electron transport layer (ETL), and a cathode. Optionally, a hole injection layer (HIL) may be disposed between the anode and HTL, or an electron injection layer (EIL) may be disposed between cathode and the ETL).

One of the challenges faced by organic electronic devices is the efficient transfer of charge between the layers of such a device. Typically, it is understood that efficient charge transport across the interface requires electron energy levels of the layers to be well matched so as to reduce the energy barriers. Small energy barrier or match of energy levels between the various layers of an organic electronic device is highly desired to achieve good device performance. However, a priori identification of optimal organic and/or inorganic components for use in the various layers of an organic electronic device remains extremely difficult.

There is an ongoing unresolved need for a good platform system to control properties of hole injection and transport layers, such as solubility, thermal/chemical stability, and electronic energy levels, such as HOMO and LUMO energy and work function, so that the compounds can be adapted for different applications and to function with different compounds, such as light emitting layers, photoactive layers, and electrodes. Also of importance is the ability to tune HIL resistivity and HIL layer thickness while retaining high transparency, low absorptivity, low internal reflection, low operating voltage, within the OLED system, and prolonged lifetime, among other properties. The ability to formulate the system for a particular application and provide the required balance of such properties is, thus, paramount.

SUMMARY OF INVENTION

An objective of the present invention is to provide the ability to modify the work function of a charge injection or transport film, typically an HIL, of an organic electronic device so as to reduce operating voltage and improve device lifetime.

In a first aspect, the present disclosure is related to a non-aqueous ink composition comprising:

(a) a polythiophene comprising a repeating unit complying with formula (I)

(I)

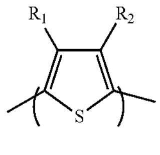

wherein $R_1$ and $R_2$ are each, independently, H, alkyl, fluoroalkyl, alkoxy, aryloxy, or —O—[Z—O]$_p$—$R_e$; wherein Z is an optionally halogenated hydrocarbylene group, p is equal to or greater than 1, and $R_e$ is H, alkyl, fluoroalkyl, or aryl;

(b) a transition metal complex having at least one β-diketonate ligand; and (c) a liquid carrier comprising one or more organic solvents.

In a second aspect, the present disclosure is directed to a process for forming a hole-carrying film, the process comprising:

1) coating a substrate with the non-aqueous ink composition described herein; and 2) annealing the coating on the substrate, thereby forming the hole-carrying film and the hole-carrying film made therefrom.

In a third aspect, the present disclosure is related to a device comprising the hole-carrying film described herein, wherein the device is an OLED, OPV, transistor, capacitor, sensor, transducer, drug release device, electrochromic device, or battery device.

In a fourth aspect, the present disclosure is related to the use of a transition metal complex having at least one β-diketonate ligand to increase the work function of a hole-carrying film in an organic light emitting device.

For easy understanding of the present invention, the essential feature and various embodiments of the present invention are enumerated below.

1. A non-aqueous ink composition comprising:

(a) a polythiophene comprising a repeating unit complying with formula (I)

(I)

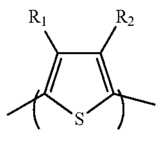

wherein $R_1$ and $R_2$ are each, independently, H, alkyl, fluoroalkyl, alkoxy, aryloxy, or —O—[Z—O]$_p$—$R_e$; wherein Z is an optionally halogenated hydrocarbylene group, p is equal to or greater than 1, and $R_e$ is H, alkyl, fluoroalkyl, or aryl;

(b) a transition metal complex having at least one β-diketonate ligand; and (c) a liquid carrier comprising one or more organic solvents.

2. The non-aqueous ink composition according to item 1 above, wherein $R_1$ and $R_2$ are each, independently, H, fluoroalkyl, $—O[C(R_aR_b)—C(R_cR_d)—O]_p—R_e$, $—OR_f$; wherein each occurrence of $R_a$, $R_b$, $R_c$, and $R_d$, are each, independently, H, halogen, alkyl, fluoroalkyl, or aryl; $R_e$ is H, alkyl, fluoroalkyl, or aryl; p is 1, 2, or 3; and $R_f$ is alkyl, fluoroalkyl, or aryl.

3. The non-aqueous ink composition according to item 1 or 2 above, wherein $R_1$ is H and $R_2$ is other than H.

4. The non-aqueous ink composition according to item 1 or 2 above, wherein $R_1$ and $R_2$ are both other than H.

5. The non-aqueous ink composition according to item 4 above, wherein $R_1$ and $R_2$ are each, independently, $—O[C(R_aR_b)—C(R_cR_d)—O]_p—R_e$, or $—OR_f$.

6. The non-aqueous ink composition according to item 5 above, wherein $R_1$ and $R_2$ are both $—O[C(R_aR_b)—C(R_cR_d)—O]_p—R_e$.

7. The non-aqueous ink composition according to any one of items 2-6 above, wherein each occurrence of $R_a$, $R_b$, $R_c$, and $R_d$, are each, independently, H, $(C_1-C_8)$ alkyl, $(C_1-C_8)$ fluoroalkyl, or phenyl; and $R_e$ is $(C_1-C_8)$alkyl, $(C_1-C_8)$ fluoroalkyl, or phenyl.

8. The non-aqueous ink composition according to any one of items 1-7 above, wherein the polythiophene comprises a repeating unit selected from the group consisting of

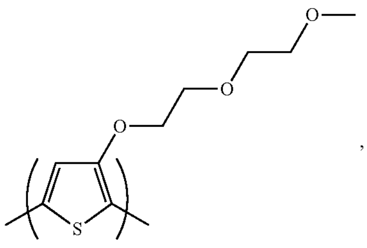

,

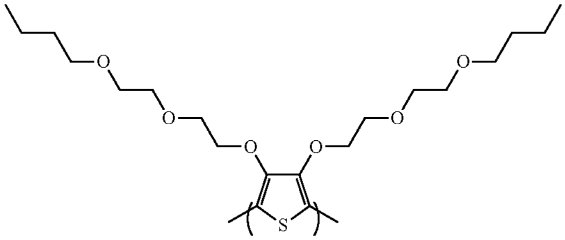

,

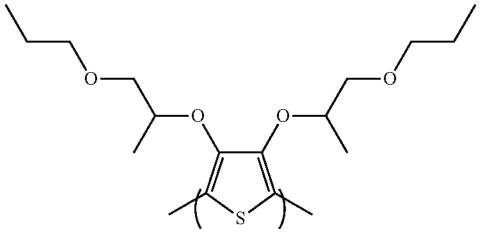

, and combinations thereof.

9. The non-aqueous ink composition according to any one of items 1-8 above, wherein the polythiophene is sulfonated.

10. The non-aqueous ink composition according to item 9 above, wherein the polythiophene is sulfonated poly(3-MEET).

11. The non-aqueous ink composition according to any one of items 1-10 above, wherein the polythiophene comprises repeating units complying with formula (I) in an amount of greater than 50% by weight, typically greater than 80% by weight, more typically greater than 90% by weight, even more typically greater than 95% by weight, based on the total weight of the repeating units.

12. The non-aqueous ink composition according to any one of items 1-11 above, wherein the transition metal complex having at least one β-diketonate ligand comprises rhenium, vanadium, molybdenum, and/or tungsten.

13. The non-aqueous ink composition according to item 12 above, wherein, the transition metal complex having at least one 3-diketonate ligand comprises molybdenum.

14. The non-aqueous ink composition according to any one of items 1-13 above, wherein the at least one β-diketonate ligand is acetylacetonate (acac) ligand.

15. The non-aqueous ink composition according to any one of items 1-14 above, wherein the transition metal complex comprises two or more 3-diketonate ligands.

16. The non-aqueous ink composition according to any one of items 1-15 above, wherein the transition metal complex further comprises at least one oxo ligand.

17. The non-aqueous ink composition according to any one of items 1-16 above, wherein the transition metal complex is bis(acetylacetonato)dioxomolybdenum(VI) ($MoO_2(acac)_2$).

18. The non-aqueous ink composition according to any one of items 1-17 above, wherein the liquid carrier comprises 1,3-butanediol, acetonitrile, ethylene glycol, 3-methoxypropionitrile, or a mixture thereof.

19. The non-aqueous ink composition according to any one of items 1-17 above, wherein the liquid carrier consists of (A) one or more glycol-based solvents.

20. The non-aqueous ink composition according to item 19 above, wherein the glycol-based solvent (A) is a glycol ether, glycol monoether or glycol.

21. The non-aqueous ink composition according to any one of items 1-17 above, wherein the liquid carrier is a liquid carrier comprising (A) one or more glycol-based solvents and (B) one or more organic solvents other than the glycol-based solvents.

22. The non-aqueous ink composition according to item 21 above, wherein the glycol-based solvent (A) is a glycol ether, glycol monoether or glycol.

23. The non-aqueous ink composition according to item 21 or 22 above, wherein the organic solvent (B) is a nitrile, alcohol, aromatic ether or aromatic hydrocarbon.

24. The non-aqueous ink composition according to any one of items 21 to 23 above, wherein the proportion by weight (wtA) of the glycol-based solvent (A) and the proportion by weight (wtB) of the organic solvent (B) satisfy the relationship represented by the following formula (1-1):

$$0.05 \leq wtB/(wtA+wtB) \leq 0.50 \quad (1\text{-}1).$$

25. The non-aqueous ink composition according to any one of items 1-24 above, wherein the amount of the transition metal complex having at least one β-diketonate ligand is from about 1 wt % to about 50 wt %, typically from about 3 wt % to about 40 wt %, more typically from about 5 wt % to about 15 wt %, when calculated as the weight of the corresponding transition metal oxide relative to the total weight of the other solids in the non-aqueous ink composition.

26. The non-aqueous ink composition according to any one of items 1-25 above, further comprising metalloid nanoparticles.

27. The non-aqueous ink composition according to item 26 above, wherein the metalloid nanoparticles comprise $B_2O_3$, $B_2O$, $SiO_2$, SiO, $GeO_2$, GeO, $As_2O_4$, $As_2O_3$, $As_2O_5$, $Sb_2O_3$, $TeO_2$, $SnO_2$, SnO, or mixtures thereof.

28. The non-aqueous ink composition according to item 27 above, wherein the metalloid nanoparticles comprise $SiO_2$.

29. The non-aqueous ink composition according to any one of items 26-28 above, wherein the amount of the metalloid nanoparticles is from 1 wt. % to 98 wt. %, typically from about 2 wt. to about 95 wt. %, more typically from about 5 wt. % to about 90 wt. %, still more typically about 10 wt. % to about 90 wt. %, relative to the combined weight of the nanoparticles and the doped or undoped polythiophene.

30. The non-aqueous ink composition according to any one of items 1-29 above, further comprising a synthetic polymer comprising one or more acidic groups.

31. The non-aqueous ink composition according to item 30 above, wherein the synthetic polymer is a polymeric acid comprising one or more repeating units comprising at least one alkyl or alkoxy group which is substituted by at least one fluorine atom and at least one sulfonic acid (—$SO_3H$) moiety, wherein said alkyl or alkoxy group is optionally interrupted by at least one ether linkage (—O—) group.

32. The non-aqueous ink composition according to item 31 above, wherein the polymeric acid comprises a repeating unit complying with formula (II) and a repeating unit complying with formula (III)

(II)

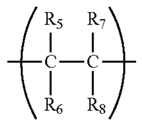

(III)

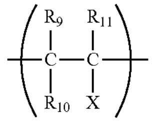

wherein each occurrence of $R_5$, $R_6$, $R_7$, $R_8$, $R_9$, $R_{10}$, and $R_{11}$ is, independently, H, halogen, fluoroalkyl, or perfluoroalkyl; and X is $—[OC(R_hR_i)—C(R_jR_k)]_q—O—[CR_lR_m]_z—SO_3H$, wherein each occurrence of $R_h$, $R_i$, $R_j$, $R_k$, $R_l$ and $R_m$ is, independently, H, halogen, fluoroalkyl, or perfluoroalkyl;

q is 0 to 10; and z is 1-5.

33. The non-aqueous ink composition according to any one of items 1-32 above, further comprising an amine compound.

34. The non-aqueous ink composition according to item 33 above, wherein the amine compound is a tertiary alkylamine.

35. The non-aqueous ink composition according to item 34 above, wherein the amine compound is triethylamine.

36. A process for forming a hole-carrying film, the process comprising:

1) coating a substrate with the non-aqueous ink composition according to any one of items 1-35 above; and
2) annealing the coating on the substrate, thereby forming the hole-carrying film.

37. The process according to item 36 above, wherein the annealing temperature is from about 25° C. to about 330° C., typically about 150° C. to about 320° C., even more typically from about 230° C. to about 300° C., still more typically from about 230° C. to about 275° C.

38. The process according to item 36 or 37 above, wherein the annealing time is from about 5 to about 40 minutes, typically from about 15 to about 30 minutes.

39. The hole-carrying film formed by the process according to any one of items 36-38 above.

40. The hole-carrying film according to item 39 above, wherein the work function of the hole-carrying film is at least 0.01 eV, at least 0.10 eV, at least 0.15 eV, at least 0.20 eV, at least 0.25 eV, or at least 0.30 eV greater than the corresponding hole-carrying film free of the transition metal complex having at least one β-diketonate ligand, as measured by the PESA-AC2 method.

41. The hole-carrying film according to item 39 or 40 above, wherein the work function is greater than 5.36 eV, typically greater than 5.45 eV, as measured by the PESA-AC2 method.

42. The hole-carrying film according to any one of items 39-41 above, wherein the work function is from about 5.36 eV to about 5.70 eV, typically from about 5.45 eV to about 5.60 eV.

43. A device comprising the hole-carrying film according to any one of items 39-42 above, wherein the device is an OLED, OPV, transistor, capacitor, sensor, transducer, drug release device, electrochromic device, or battery device.

44. The device according to item 43 above, wherein the device is an OLED further comprising a hole transport layer.

45. The device according to item 44 above, wherein the hole transport layer comprises tris(4-carbazoyl-9-ylphenyl) amine.

46. Use of a transition metal complex having at least one β-diketonate ligand to increase the work function of a hole-carrying film in an organic light emitting device, wherein the hole-carrying film comprises a polythiophene comprising a repeating unit complying with formula (I)

(I)

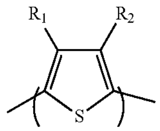

wherein $R_1$ and $R_2$ are each, independently, H, alkyl, fluoroalkyl, alkoxy, aryloxy, or $—O—[Z—O]_p—R_e$;

wherein

Z is an optionally halogenated hydrocarbylene group, p is equal to or greater than 1, and $R_e$ is H, alkyl, fluoroalkyl, or aryl.

47. The use according to item 46 above, wherein the work function of the hole-carrying film is increased by at least 0.01 eV, at least 0.10 eV, at least 0.15 eV, at least 0.20 eV, at least 0.25 eV, or at least 0.30 eV when compared to the corresponding hole-carrying film free of transition metal complex having at least one β-diketonate ligand, as measured by the PESA-AC2 method.

BRIEF DESCRIPTION OF DRAWINGS

FIG. 1 shows the work function of films made from NQ inks 1 and 3-5 (squares) as a function of $MoO_3$ concentration.

FIG. 2 shows the current density vs. voltage comparison between HILs made from NQ ink 2 and NQ ink 3 in each of device A and B.

FIG. 3 shows the voltage vs. time comparison between HILs made from NQ ink 2 and NQ ink 3 in each of device A and B.

FIG. 4 shows the current density vs. voltage comparison between HILs made from NQ ink 2 and NQ ink 5 in each of device A and B.

FIG. 5 shows the voltage vs. time comparison between HILs made from NQ ink 2 and NQ ink 5 in each of device A and B.

DESCRIPTION OF EMBODIMENTS

As used herein, the terms "a", "an", or "the" means "one or more" or "at least one" unless otherwise stated.

As used herein, the term "comprises" includes "consists essentially of" and "consists of." The term "comprising" includes "consisting essentially of" and "consisting of."

The phrase "free of" means that there is no external addition of the material modified by the phrase and that there is no detectable amount of the material that may be observed by analytical techniques known to the ordinarily-skilled artisan, such as, for example, gas or liquid chromatography, spectrophotometry, optical microscopy, and the like.

Throughout the present disclosure, various publications may be incorporated by reference. Should the meaning of any language in such publications incorporated by reference conflict with the meaning of the language of the present disclosure, the meaning of the language of the present disclosure shall take precedence, unless otherwise indicated.

As used herein, the terminology "(Cx-Cy)" in reference to an organic group, wherein x and y are each integers, means that the group may contain from x carbon atoms to y carbon atoms per group.

As used herein, the term "alkyl" means a monovalent straight or branched saturated hydrocarbon radical, more typically, a monovalent straight or branched saturated ($C_1$-$C_{40}$)hydrocarbon radical, such as, for example, methyl, ethyl, n-propyl, isopropyl, n-butyl, isobutyl, tert-butyl, hexyl, 2-ethylhexyl, octyl, hexadecyl, octadecyl, eicosyl, behenyl, tricontyl, and tetracontyl.

As used herein, the term "fluoroalkyl" means an alkyl radical as defined herein, more typically a ($C_1$-$C_{40}$) alkyl radical that is substituted with one or more fluorine atoms. Examples of fluoroalkyl groups include, for example, difluoromethyl, trifluoromethyl, perfluoroalkyl, 1H,1H,2H,2H-perfluorooctyl, perfluoroethyl, and $—CH_2CF_3$.

As used herein, the term "hydrocarbylene" means a divalent radical formed by removing two hydrogen atoms from a hydrocarbon, typically a ($C_1$-$C_{40}$) hydrocarbon. Hydrocarbylene groups may be straight, branched or cyclic, and may be saturated or unsaturated. Examples of hydrocarbylene groups include, but are not limited to, methylene, ethylene, 1-methylethylene, 1-phenylethylene, propylene, butylene, 1,2-benzene; 1,3-benzene; 1,4-benzene; and 2,6-naphthalene.

As used herein, the term "alkoxy" means a monovalent radical denoted as —O-alkyl, wherein the alkyl group is as defined herein. Examples of alkoxy groups, include, but are not limited to, methoxy, ethoxy, n-propoxy, isopropoxy, n-butoxy, isobutoxy, and tert-butoxy.

As used herein, the term "aryl" means a monovalent unsaturated hydrocarbon radical containing one or more six-membered carbon rings in which the unsaturation may be represented by three conjugated double bonds. Aryl radicals include monocyclic aryl and polycyclic aryl. Polycyclic aryl refers to a monovalent unsaturated hydrocarbon radical containing more than one six-membered carbon ring in which the unsaturation may be represented by three conjugated double bonds wherein adjacent rings may be linked to each other by one or more bonds or divalent bridging groups or may be fused together. Examples of aryl radicals include, but are not limited to, phenyl, anthracenyl, naphthyl, phenanthrenyl, fluorenyl, and pyrenyl.

As used herein, the term "aryloxy" means a monovalent radical denoted as —O-aryl, wherein the aryl group is as defined herein. Examples of aryloxy groups, include, but are not limited to, phenoxy, anthracenoxy, naphthoxy, phenanthrenoxy, and fluorenoxy.

Any substituent or radical described herein may optionally be substituted at one or more carbon atoms with one or more, same or different, substituents described herein. For instance, a hydrocarbylene group may be further substituted with an aryl group or an alkyl group. Any substituent or radical described herein may also optionally be substituted at one or more carbon atoms with one or more substituents selected from the group consisting of halogen, such as, for example, F, Cl, Br, and I; nitro ($NO_2$), cyano (CN), and hydroxy (OH).

As used herein, the term "hole carrier compound" refers to any compound that is capable of facilitating the movement of holes, i.e., positive charge carriers, and/or blocking the movement of electrons, for example, in an electronic device. Hole carrier compounds include compounds useful in hole transport layers (HTLs), hole injection layers (HILs) and electron blocking layers (EBLs) of electronic devices, typically organic electronic devices, such as, for example, organic light emitting devices.

As used herein, the term "doped" in reference to a hole carrier compound, for example, a polythiophene polymer, means that the hole carrier compound has undergone a chemical transformation, typically an oxidation or reduction reaction, more typically an oxidation reaction, facilitated by a dopant. As used herein, the term "dopant" refers to a substance that oxidizes or reduces, typically oxidizes, a hole carrier compound, for example, a polythiophene polymer. Herein, the process wherein a hole carrier compound undergoes a chemical transformation, typically an oxidation or reduction reaction, more typically an oxidation reaction, facilitated by a dopant is called a "doping reaction" or simply "doping". Doping alters the properties of the polythiophene polymer, which properties may include, but may not be limited to, electrical properties, such as resistivity and work function, mechanical properties, and optical properties. In the course of a doping reaction, the hole carrier compound becomes charged, and the dopant, as a result of the doping reaction, becomes the oppositely-charged counterion for the doped hole carrier compound. As used herein, a substance must chemically react, oxidize or reduce, typically oxidize, a hole carrier compound to be referred to as a dopant. Substances that do not react with the hole carrier compound but may act as counterions are not considered dopants according to the present disclosure. Accordingly, the term "undoped" in reference to a hole carrier compound, for example a polythiophene polymer, means that the hole carrier compound has not undergone a doping reaction as described herein.

The present disclosure relates to a non-aqueous ink composition comprising:

(a) a polythiophene comprising a repeating unit complying with formula (I)

(I)

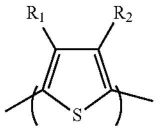

wherein $R_1$ and $R_2$ are each, independently, H, alkyl, fluoroalkyl, alkoxy, aryloxy, or —O—[Z—O]$_p$—$R_e$;

wherein

Z is an optionally halogenated hydrocarbylene group, p is equal to or greater than 1, and $R_e$ is H, alkyl, fluoroalkyl, or aryl;

(b) a transition metal complex having at least one β-diketonate ligand; and (c) a liquid carrier comprising one or more organic solvents.

The polythiophene suitable for use according to the present disclosure comprises a repeating unit complying with formula (I)

(I)

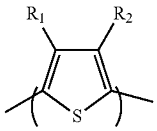

wherein $R_1$ and $R_2$ are each, independently, H, alkyl, fluoroalkyl, alkoxy, aryloxy, or —O—[Z—O]$_p$—$R_e$; wherein Z is an optionally halogenated hydrocarbylene group, p is equal to or greater than 1, and $R_e$ is H, alkyl, fluoroalkyl, or aryl.

In an embodiment, $R_1$ and $R_2$ are each, independently, H, fluoroalkyl, —O[C($R_aR_b$)—C($R_cR_d$)—O]$_p$—$R_e$, —$OR_f$; wherein each occurrence of $R_a$, $R_b$, $R_c$, and $R_d$, are each, independently, H, halogen, alkyl, fluoroalkyl, or aryl; $R_e$ is H, alkyl, fluoroalkyl, or aryl; p is 1, 2, or 3; and $R_f$ is alkyl, fluoroalkyl, or aryl.

In an embodiment, $R_1$ is H and $R_2$ is other than H. In such an embodiment, the repeating unit is derived from a 3-substituted thiophene.

The polythiophene can be a regiorandom or a regioregular compound. Due to its asymmetrical structure, the polymerization of 3-substituted thiophenes produces a mixture of polythiophene structures containing three possible regiochemical linkages between repeat units. The three orientations available when two thiophene rings are joined are the 2,2'; 2,5', and 5,5' couplings. The 2,2' (or head-to-head) coupling and the 5,5' (or tail-to-tail) coupling are referred to as regiorandom couplings. In contrast, the 2,5' (or head-to-tail) coupling is referred to as a regioregular coupling. The degree of regioregularity can be, for example, about 0 to 100%, or about 25 to 99.9%, or about 50 to 98%. Regioregularity may be determined by standard methods known to those of ordinary skill in the art, such as, for example, using NMR spectroscopy.

In an embodiment, the polythiophene is regioregular. In some embodiments, the regioregularity of the polythiophene can be at least about 85%, typically at least about 95%, more typically at least about 98%. In some embodiments, the degree of regioregularity can be at least about 70%, typically at least about 80%. In yet other embodiments, the regioregular polythiophene has a degree of regioregularity of at least about 90%, typically a degree of regioregularity of at least about 98%.

3-substituted thiophene monomers, including polymers derived from such monomers, are commercially-available or may be made by methods known to those of ordinary skill in the art. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al.

In another embodiment, $R_1$ and $R_2$ are both other than H. In such an embodiment, the repeating unit is derived from a 3,4-disubstituted thiophene.

In an embodiment, $R_1$ and $R_2$ are each, independently, —O[C($R_aR_b$)—C($R_cR_d$)—O]$_p$—$R_e$, or —$OR_f$. In an embodiment, $R_1$ and $R_2$ are both —O[C($R_aR_b$)—C($R_cR_d$)—O]$_p$—$R_e$. $R_1$ and $R_2$ may be the same or different.

In an embodiment, each occurrence of $R_a$, $R_b$, $R_c$, and $R_d$, are each, independently, H, ($C_1$-$C_8$)alkyl, ($C_1$-$C_8$)fluoroalkyl, or phenyl; and $R_e$ is ($C_1$-$C_8$)alkyl, ($C_1$-$C_8$)fluoroalkyl, or phenyl.

In an embodiment, $R_1$ and $R_2$ are each —O[$CH_2$—$CH_2$—O]$_p$—$R_e$. In an embodiment, $R_1$ and $R_2$ are each —O[CH($CH_3$)—$CH_2$—O]$_p$—$R_e$.

In an embodiment, $R_e$ is methyl, propyl, or butyl.

In an embodiment, the polythiophene comprises a repeating unit selected from the group consisting of

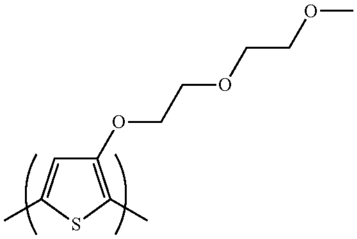

,

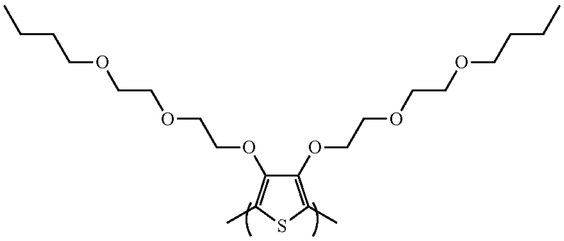

,

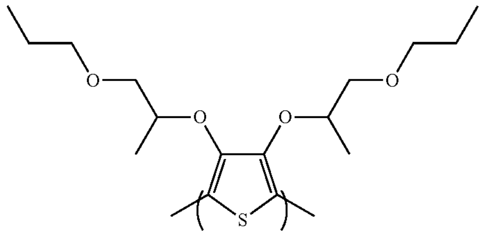

,

-continued

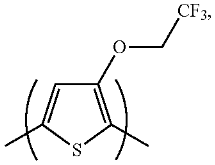

and combinations thereof.

It would be understood by the ordinarily-skilled artisan that the repeating unit

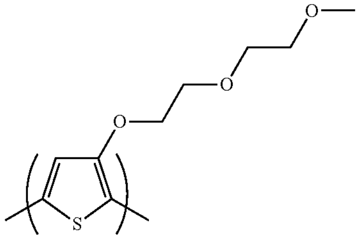

is derived from a monomer represented by the structure

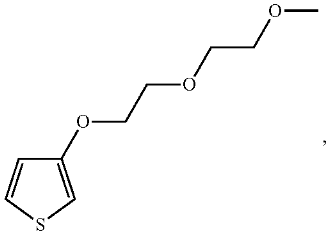

, 3-(2-(2-methoxyethoxy)ethoxy)thiophene [referred to herein as 3-MEET];

the repeating unit

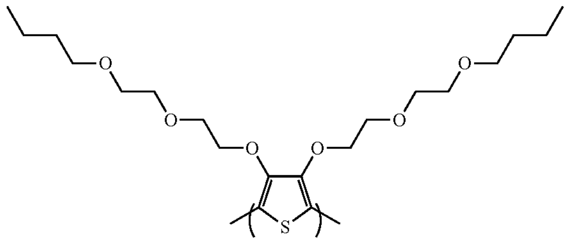

is derived from a monomer represented by the structure

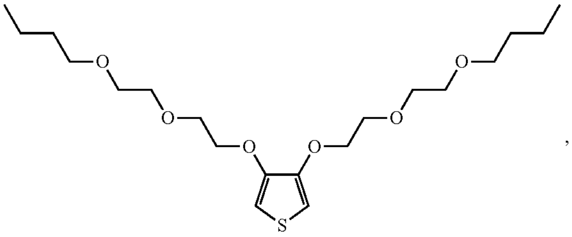 [SMILES: CCCCOCCOCCOc1cscc1OCCOCCOCCCC]

, 3,4-bis(2-(2-butoxyethoxy)ethoxy)thiophene [referred to herein as 3,4-diBEET];

the repeating unit

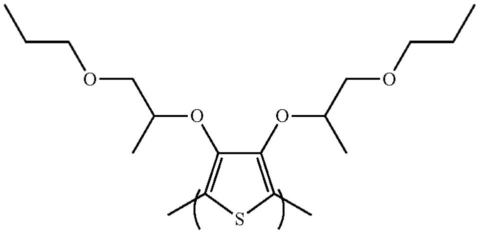

, is derived from a monomer represented by the structure

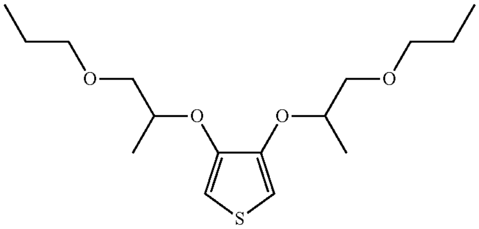

, 3,4-bis((1-propoxypropan-2-yl)oxy)thiophene [referred to herein as 3,4-diPPT]; and the repeating unit

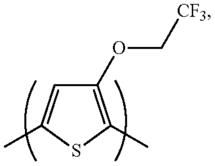

is derived from a monomer represented by the structure

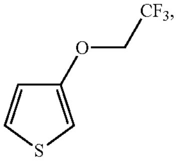 [SMILES: FC(F)(F)COc1ccsc1]

3-(2,2,2-trifluoroethoxy)thiophene [referred to herein as 3-TFET].

3,4-disubstituted thiophene monomers, including polymers derived from such monomers, are commercially-available or may be made by methods known to those of ordinary skill in the art. For example, a 3,4-disubstituted thiophene monomer may be produced by reacting 3,4-dibromothiophene with the metal salt, typically sodium salt, of a compound given by the formula HO—[Z—O]$_p$—$R_e$ or $HOR_f$, wherein Z, $R_e$, $R_f$ and p are as defined herein.

The polymerization of 3,4-disubstituted thiophene monomers may be carried out by, first, brominating the 2 and 5 positions of the 3,4-disubstituted thiophene monomer to form the corresponding 2,5-dibromo derivative of the 3,4-disubstituted thiophene monomer. The polymer can then be obtained by GRIM (Grignard methathesis) polymerization of the 2,5-dibromo derivative of the 3,4-disubstituted thiophene in the presence of a nickel catalyst. Such a method is described, for example, in U.S. Pat. No. 8,865,025, the entirety of which is hereby incorporated by reference. Another known method of polymerizing thiophene monomers is by oxidative polymerization using organic non-metal containing oxidants, such as 2,3-dichloro-5,6-dicyano-1,4-benzoquinone (DDQ), or using a transition metal halide, such as, for example, iron(III) chloride, molybdenum(V) chloride, and ruthenium(III) chloride, as oxidizing agent.

Examples of compounds having the formula HO—[Z—O]$_p$—$R_e$ or $HOR_f$ that may be converted to the metal salt, typically sodium salt, and used to produce 3,4-disubstituted thiophene monomers include, but are not limited to, trifluoroethanol, ethylene glycol monohexyl ether (hexyl Cellosolve), propylene glycol monobutyl ether (Dowanol PnB), diethylene glycol monoethyl ether (ethyl Carbitol), dipropylene glycol n-butyl ether (Dowanol DPnB), diethylene glycol monophenyl ether (phenyl Carbitol), ethylene glycol monobutyl ether (butyl Cellosolve), diethylene glycol monobutyl ether (butyl Carbitol), dipropylene glycol monomethyl ether (Dowanol DPM), diisobutyl carbinol, 2-ethylhexyl alcohol, methyl isobutyl carbinol, ethylene glycol monophenyl ether (Dowanol Eph), propylene glycol monopropyl ether (Dowanol PnP), propylene glycol monophenyl ether (Dowanol PPh), diethylene glycol monopropyl ether (propyl Carbitol), diethylene glycol monohexyl ether (hexyl Carbitol), 2-ethylhexyl carbitol, dipropylene glycol monopropyl ether (Dowanol DPnP), tripropylene glycol monomethyl ether (Dowanol TPM), diethylene glycol monomethyl ether (methyl Carbitol), and tripropylene glycol monobutyl ether (Dowanol TPnB).

The polythiophene having a repeating unit complying with formula (I) of the present disclosure may be further modified subsequent to its formation by polymerization. For instance, polythiophenes having one or more repeating units derived from 3-substituted thiophene monomers may possess one or more sites where hydrogen may be replaced by a substituent, such as a sulfonic acid group (—$SO_3H$) by sulfonation.

As used herein, the term "sulfonated" in relation to the polythiophene polymer means that the polythiophene comprises one or more sulfonic acid groups (—$SO_3H$). The sulfur atom of the —$SO_3H$ group may be directly bonded to the backbone of the polythiophene polymer and/or to a side group. For the purpose of the present disclosure, a side group is a monovalent radical that when theoretically or actually removed from the polymer does not shorten the length of the polymer chain. Typically, the sulfur atom of the —$SO_3H$ group is directly bonded to the backbone of the polythiophene polymer and not to a side group. The sulfonated polythiophene polymer and/or copolymer may be made using any method known to those of ordinary skill in the art. For example, the polythiophene may be sulfonated by reacting the polythiophene with a sulfonating reagent such as, for example, fuming sulfuric acid, acetyl sulfate, pyridine $SO_3$, or the like. In another example, monomers may be sulfonated using a sulfonating reagent and then polymerized according to known methods and/or methods described herein. It would be understood by the ordinarily-skilled artisan that sulfonic acid groups in the presence of a basic compound, for example, alkali metal hydroxides, ammonia, and alkylamines, such as, for example, mono-, di-, and trialkylamines, such as, for example, triethylamine, may result in the formation of the corresponding salt or adduct. Thus, the term "sulfonated" in relation to the polythiophene polymer includes the meaning that the polythiophene may comprise one or more —$SO_3M$ groups, wherein M may be an alkali metal ion, such as, for example, $Na^+$, $Li^+$, $K^+$, $Rb^+$, $Cs^+$; ammonium ($NH_4^+$), mono-, di-, and trialkylammonium, such as triethylammonium.

The sulfonation of conjugated polymers and sulfonated conjugated polymers, including sulfonated polythiophenes, are described in U.S. Pat. No. 8,017,241 to Seshadri et al., which is incorporated herein by reference in its entirety.

In an embodiment, the polythiophene is sulfonated.

In an embodiment, the polythiophene is sulfonated poly (3-MEET).

The polythiophene polymers used according to the present disclosure may be homopolymers or copolymers, including statistical, random, gradient, and block copolymers. For a polymer comprising a monomer A and a monomer B, block copolymers include, for example, A-B diblock copolymers, A-B-A triblock copolymers, and -(AB)$_n$-multiblock copolymers. The polythiophene may comprise repeating units derived from other types of monomers such as, for example, thienothiophenes, selenophenes, pyrroles, furans, tellurophenes, anilines, arylamines, and arylenes, such as, for example, phenylenes, phenylene vinylenes, and fluorenes.

In an embodiment, the polythiophene comprises repeating units complying with formula (I) in an amount of greater than 50% by weight, typically greater than 80% by weight, more typically greater than 90% by weight, even more typically greater than 95% by weight, based on the total weight of the repeating units.

It would be clear to a person of ordinary skill in the art that, depending on the purity of the starting monomer compound(s) used in the polymerization, the polymer formed may contain repeating units derived from impurities. As used herein, the term "homopolymer" is intended to mean a polymer comprising repeating units derived from one type of monomer, but may contain repeating units derived from impurities. In an embodiment, the polythiophene is a homopolymer wherein essentially all of the repeating units are repeating units complying with formula (I).

The polythiophene polymer typically has a number average molecular weight between about 1,000 and 1,000,000 g/mol. More typically, the conjugated polymer has a number average molecular weight between about 5,000 and 100,000 g/mol, even more typically about 10,000 to about 50,000 g/mol. Number average molecular weight may be determined according to methods known to those of ordinary skill in the art, such as, for example, by gel permeation chromatography.

The non-aqueous ink composition of the present disclosure may optionally further comprise other hole carrier compounds.

Optional hole carrier compounds include, for example, low molecular weight compounds or high molecular weight compounds. The optional hole carrier compounds may be non-polymeric or polymeric. Non-polymeric hole carrier compounds include, but are not limited to, cross-linkable and non-crosslinked small molecules. Examples of non-polymeric hole carrier compounds include, but are not limited to, N,N'-bis(3-methylphenyl)-N,N'-bis(phenyl)benzidine (CAS #65181-78-4); N,N'-bis(4-methylphenyl)-N,N'-bis(phenyl)benzidine; N,N'-bis(2-naphtalenyl)-N—N'-bis(phenylbenzidine) (CAS #139255-17-1); 1,3,5-tris(3-methyldiphenylamino)benzene (also referred to as m-MTDAB); N,N'-bis(1-naphtalenyl)-N,N'-bis(phenyl)benzidine (CAS #123847-85-8, NPB); 4,4',4"-tris(N,N-phenyl- 3-methylphenylamino)triphenylamine (also referred to as m-MTDATA, CAS #124729-98-2); 4,4',N,N'-diphenylcarbazole (also referred to as CBP, CAS #58328-31-7); 1,3,5-tris(diphenylamino)benzene; 1,3,5-tris(2-(9-ethylcarbazyl-3)ethylene)benzene; 1,3,5-tris[(3-methylphenyl)phenylamino]benzene; 1,3-bis(N-carbazolyl)benzene; 1,4-bis(diphenylamino)benzene; 4,4'-bis(N-carbazolyl)-1,1'-biphenyl; 4,4'-bis(N-carbazolyl)-1,1'-biphenyl; 4-(dibenzylamino)benzaldehyde-N,N-diphenylhydrazone; 4-(diethylamino)benzaldehyde diphenylhydrazone; 4-(dimethylamino)benzaldehyde diphenylhydrazone; 4-(diphenylamino)benzaldehyde diphenylhydrazone; 9-ethyl-3-carbazolecarboxaldehyde diphenylhydrazone; copper(II) phthalocyanine; N,N'-bis(3-methylphenyl)-N,N'-diphenylbenzidine; N,N'-di-[(1-naphthyl)-N,N'-diphenyl]-1,1'-biphenyl)-4,4'-diamine; N,N'-diphenyl-N,N'-di-p-tolylbenzene-1,4-diamine; tetra-N-phenylbenzidine; titanyl phthalocyanine; tri-p-tolylamine; tris(4-carbazoyl-9-ylphenyl)amine (TCTA); and tris[4-(diethylamino)phenyl]amine.

Optional polymeric hole carrier compounds include, but are not limited to, poly[(9,9-dihexylfluorenyl-2,7-diyl)-alt-co-(N,N'bis{p-butylphenyl}-1,4-diaminophenylene)]; poly[(9,9-dioctylfluorenyl-2,7-diyl)-alt-co-(N,N'-bis{p-butylphenyl}-1,1'-biphenylene-4,4'-diamine)]; poly(9,9-dioctylfluorene-co-N-(4-butylphenyl)diphenylamine) (also referred to as TFB) and poly[N,N'-bis(4-butylphenyl)-N,N'-bis(phenyl)-benzidine] (commonly referred to as poly-TPD).

Other optional hole carrier compounds are described in, for example, US Patent Publications 2010/0292399 published Nov. 18, 2010; 2010/010900 published May 6, 2010; and 2010/0108954 published May 6, 2010. Optional hole carrier compounds described herein are known in the art and are commercially available.

The polythiophene comprising a repeating unit complying with formula (I) may be doped or undoped.

In an embodiment, the polythiophene comprising a repeating unit complying with formula (I) is doped with a dopant. Dopants are known in the art. See, for example, U.S. Pat. No. 7,070,867; US Publication 2005/0123793; and US Publication 2004/0113127. The dopant can be an ionic compound. The dopant can comprise a cation and an anion. One or more dopants may be used to dope the polythiophene comprising a repeating unit complying with formula (I).

The cation of the ionic compound can be, for example, V, Cr, Mn, Fe, Co, Ni, Cu, Nb, Mo, Tc, Ru, Rh, Pd, Ag, Ta, W, Re, Os, Ir, Pt, or Au.

The cation of the ionic compound can be, for example, gold, molybdenum, rhenium, iron, and silver cation.

In some embodiments, the dopant can comprise a sulfonate or a carboxylate, including alkyl, aryl, and heteroaryl sulfonates and carboxylates. As used herein, “sulfonate” refers to a —$SO_3M$ group, wherein M may be $H^+$ or an alkali metal ion, such as, for example, $Na^+$, $Li^+$, $K^+$, $Rb^+$, $Cs^+$; or ammonium ($NH_4^+$). As used herein, “carboxylate” refers to a —$CO_2M$ group, wherein M may be $H^+$ or an alkali metal ion, such as, for example, $Na^+$, $Li^+$, $K^+$, $Rb^+$, $Cs^+$; or ammonium ($NH_4^+$). Examples of sulfonate and carboxylate dopants include, but are not limited to, benzoate compounds, heptafluorobutyrate, methanesulfonate, trifluoromethanesulfonate, p-toluenesulfonate, pentafluoropropionate, and polymeric sulfonates, perfluorosulfonate-containing ionomers, and the like.

In some embodiments, the dopant does not comprise a sulfonate or a carboxylate.

In some embodiments, dopants may comprise sulfonylimides, such as, for example, bis(trifluoromethanesulfonyl)imide; antimonates, such as, for example, hexafluoroantimonate; arsenates, such as, for example, hexafluoroarsenate; phosphorus compounds, such as, for example, hexafluorophosphate; and borates, such as, for example, tetrafluoroborate, tetraarylborates, and trifluoroborates. Examples of tetraarylborates include, but are not limited to, halogenatedtetraarylborates, such as tetrakispentafluorophenylborate (TPFB). Examples of trifluoroborates include, but are not limited to, (2-nitrophenyl)trifluoroborate, benzofurazan-5-trifluoroborate, pyrimidine-5-trifluoroborate, pyridine-3-trifluoroborate, and 2,5-dimethylthiophene-3-trifluoroborate.

As disclosed herein, the polythiophene can be doped with a dopant. A dopant can be, for example, a material that will undergo one or more electron transfer reaction(s) with, for example, a conjugated polymer, thereby yielding a doped polythiophene. The dopant can be selected to provide a suitable charge balancing counter-anion. A reaction can occur upon mixing of the polythiophene and the dopant as known in the art. For example, the dopant may undergo spontaneous electron transfer from the polymer to a cation-anion dopant, such as a metal salt, leaving behind a conjugated polymer in its oxidized form with an associated anion and free metal. See, for example, Lebedev et al., Chem. Mater., 1998, 10, 156-163. As disclosed herein, the polythiophene and the dopant can refer to components that will react to form a doped polymer. The doping reaction can be a charge transfer reaction, wherein charge carriers are generated, and the reaction can be reversible or irreversible. In some embodiments, silver ions may undergo electron transfer to or from silver metal and the doped polymer.

In the final formulation, the composition can be distinctly different from the combination of original components (i.e., polythiophene and/or dopant may or may not be present in the final composition in the same form before mixing).

Some embodiments allow for removal of reaction by-products from the doping process. For example, the metals, such as silver, can be removed by filtrations.

Materials can be purified to remove, for example, halogens and metals. Halogens include, for example, chloride, bromide and iodide. Metals include, for example, the cation of the dopant, including the reduced form of the cation of the dopant, or metals left from catalyst or initiator residues. Metals include, for example, silver, nickel, and magnesium. The amounts can be less than, for example, 100 ppm, or less than 10 ppm, or less than 1 ppm.

Metal content, including silver content, can be measured by ICP-MS, particularly for concentrations greater than 50 ppm.

In an embodiment, when the polythiophene is doped with a dopant, the polythiophene and the dopant are mixed to form a doped polymer composition. Mixing may be achieved using any method known to those of ordinary skill in the art. For example, a solution comprising the polythiophene may be mixed with a separate solution comprising the dopant. The solvent or solvents used to dissolve the polythiophene and the dopant may be one or more solvents described herein. A reaction can occur upon mixing of the polythiophene and the dopant as known in the art. The resulting doped polythiophene composition comprises between about 40% and 75% by weight of the polymer and between about 25% and 55% by weight of the dopant, based on the composition. In another embodiment, the doped polythiophene composition comprises between about 50% and 65% for the polythiophene and between about 35% and 50% of the dopant, based on the composition. Typically, the amount by weight of the polythiophene is greater than the amount by weight of the dopant. Typically, the dopant can be a silver salt, such as silver tetrakis(pentafluorophenyl) borate in an amount of about 0.25 to 0.5 m/ru, wherein m is the molar amount of silver salt and ru is the molar amount of polymer repeat unit.

The doped polythiophene is isolated according to methods known to those of ordinary skill in the art, such as, for example, by freeze drying, spray-drying, and/or rotary evaporation of the solvent, to obtain a dry or substantially dry material, such as a powder. The amount of residual solvent can be, for example, 10 wt. % or less, or 5 wt. % or less, or 1 wt. % or less, based on the dry or substantially dry material. The dry or substantially dry powder can be redispersed or redissolved in one or more new solvents.

The NQ ink composition according to the present disclosure comprises a transition metal complex having at least one β-diketonate ligand.

Herein, a transition metal complex refers to a compound wherein a transition metal is connected to one or more ligands, at least one of which is a β-diketonate ligand.

The transition metal may be selected from the group consisting of gold, silver, copper, nickel, cobalt, palladium, platinum, iridium, osmium, rhodium, ruthenium, rhenium, vanadium, chromium, manganese, niobium, molybdenum, tungsten, tantalum, titanium, zirconium, zinc, mercury, yttrium, iron and cadmium.

As used herein, β-diketonate ligand refers to the enol or enolate derived from the corresponding 3-diketone, or 1,3-diketone. Examples of suitable β-diketonate ligands include, but are not limited to, 6,6,7,7,8,8,8-feptafluoro-2,2-dimethyl-3,5-octanedione; 2,2,6,6-tetramethyl-3,5-heptanedionate; trifluoroacetylacetonate, acetylacetonate (acac), hexafluoroacetylacetonate, and mixtures thereof.

In an embodiment, the transition metal complex having at least one β-diketonate ligand comprises rhenium, vanadium, molybdenum, and/or tungsten.

In another embodiment, the transition metal complex having at least one β-diketonate ligand comprises molybdenum.

In an embodiment, the at least one β-diketonate ligand is acetylacetonate (acac) ligand.

In an embodiment, the transition metal complex comprises two or more β-diketonate ligands.

The transition metal complex having at least one β-diketonate ligand may further comprise other ligands.

Optional ligands suitable for use according to the present disclosure may be inorganic or organic ligands. Such ligands may also be monodentate, bidentate, or polydentate. Inorganic monodentate ligands include, but are not limited to, amine ($NH_3$), aqua ($H_2O$), azido ($N_3$), halogeno, such as bromide (Br), chloride (Cl), and fluoride (F), and nitrito ($NO_2$). Inorganic bidentate ligands include, but are not limited to, oxo (O) and sulfato ($SO_4$).

As used herein, organic ligands are compounds comprising one or more carbon atoms and are capable of forming one or more bonds with a metal, typically a transition metal. Organic ligands may comprise one or more heteroatoms, such as, for example, O, N, and/or S. Suitable monodentate organic ligands include, but are not limited to, cyanide (CN), carbonyl (CO), thiocyanato (SCN), and mixtures thereof. Suitable bidentate organic ligands include, but are not limited to, β-diketonates, picolinate (pic), substituted picolinate, salicylidene, 8-hydroxyquinolinate; amino acids, salicylaldehydes, and iminoacetonates, ethylene diamine derivatives, amidinate, biphenyl, bipyridyl, phenylpyridyl, 2-(1-naphthyl)benzoxazole, 2-phenylbenzoxazole, 2-phenylbenzothiazole, coumarin, thienylpyridine, benzothienylpyridine, thienylpyridine, tolylpyridine, phenylimines, vinylpyridines, arylquinolines, pyridyl-naphthalenes, pyridylpyrroles, pyridylimidazoles, phenylindoles, derivatives thereof, and mixtures thereof.

In an embodiment, the transition metal complex having at least one β-diketonate ligand further comprises at least one oxo ligand.

Suitable transition metal complexes having at least one β-diketonate ligand that may be used include, but are not limited to β-diketonates of rhenium, such as $Re(acac)_2Cl_2$; vanadium, such as $VO(acac)_2$; molybdenum, such as $MoO_2(acac)_2$; and/or tungsten, such as $WO_2(acac)_2$. Such transition metal complexes may be obtained commercially or synthesized using methods known to those of ordinary skill in the art. For example, $Re(acac)_2Cl_2$ may be made according to a known procedure (W. D. Courier, et al. Can. J. Chem. (1972) 50, pp. 1797-1806) and $WO_2(acac)_2$ may be made according to another known procedure (Yu and Holm, Inorg. Chem. (1989), vol. 28, no. 24, pp. 4385-4391).

In an embodiment, the transition metal complex having at least one β-diketonate ligand is bis(acetylacetonato)dioxomolybdenum(VI) ($MoO_2(acac)_2$).

The amount of the transition metal complex having at least one β-diketonate ligand in the non-aqueous ink composition according to the present disclosure is from about 1 wt % to about 50 wt %, typically from about 3 wt % to about 40 wt %, more typically from about 5 wt % to about 15 wt %, when calculated as the weight of the corresponding transition metal oxide relative to the total weight of the other solids in the non-aqueous ink composition. Herein, the term “other solids” refers to solids other than the transition metal complex and/or the corresponding transition metal oxide. Without wishing to be bound to theory, it is believed that the transition metal complex having at least one β-diketonate ligand decomposes to form the corresponding transition metal oxide upon heating, for example, in a process for forming a hole-carrying film.

The non-aqueous ink compositions of the present disclosure may further comprise metalloid nanoparticles.

As used herein, the term “metalloid” refers to an element having chemical and/or physical properties intermediate of, or that are a mixture of, those of metals and nonmetals. Herein, the term “metalloid” refers to boron (B), silicon (Si), germanium (Ge), arsenic (As), antimony (Sb), and tellurium (Te).

As used herein, the term “nanoparticle” refers to a nanoscale particle, the number average diameter of which is typically less than or equal to 500 nm. The number average diameter may be determined using techniques and instrumentation known to those of ordinary skill in the art. For instance, transmission electron microscopy (TEM) may be used.

TEM may be used to characterize size and size distribution, among other properties, of the metalloid nanoparticles. Generally, TEM works by passing an electron beam through a thin sample to form an image of the area covered by the electron beam with magnification high enough to observe the lattice structure of a crystal. The measurement sample is prepared by evaporating a dispersion having a suitable concentration of nanoparticles on a specially-made mesh grid. The crystal quality of the nanoparticles can be measured by the electron diffraction pattern and the size and shape of the nanoparticles can be observed in the resulting micrograph image. Typically, the number of nanoparticles and projected two-dimensional area of every nanoparticle in the field-of-view of the image, or fields-of-view of multiple images of the same sample at different locations, are determined using image processing software, such as ImageJ (available from US National Institutes of Health). The projected two-dimensional area, A, of each nanoparticle measured is used to calculate its circular equivalent diameter, or area-equivalent diameter, $x_A$, which is defined as the diameter of a circle with the same area as the nanoparticle. The circular equivalent diameter is simply given by the equation $$x_A = \sqrt{\frac{4A}{\pi}}$$

The arithmetic average of the circular equivalent diameters of all of the nanoparticles in the observed image is then calculated to arrive at the number average particle diameter, as used herein. A variety of TEM microscopes available, for instance, Jeol JEM-2100F Field Emission TEM and Jeol JEM 2100 LaB6 TEM (available from JEOL USA). It is understood that all TE microscopes function on similar principles and when operated according to standard procedures, the results are interchangeable.

The number average particle diameter of the metalloid nanoparticles described herein is less than or equal to 500 nm; less than or equal to 250 nm; less than or equal to 100 nm; or less than or equal to 50 nm; or less than or equal to 25 nm. Typically, the metalloid nanoparticles have number average particle diameter from about 1 nm to about 100 nm, more typically from about 2 nm to about 30 nm.

The shape or geometry of metalloid nanoparticles of the present disclosure can be characterized by number average aspect ratio. As used herein, the terminology "aspect ratio" means the ratio of the Feret's minimum length to the Feret's maximum length, or $$\frac{x_{Fmin}}{x_{Fmax}}.$$

As used herein, the maximum Feret's diameter, $x_{Fmax}$, is defined as the furthest distance between any two parallel tangents on the two-dimensional projection of a particle in a TEM micrograph. Likewise, the minimum Feret's diameter, $x_{Fmin}$, is defined as the shortest distance between any two parallel tangents on the two-dimensional projection of a particle in a TEM micrograph. The aspect ratio of each particle in the field-of-view of a micrograph is calculated and the arithmetic average of the aspect ratios of all of the particles in the image is calculated to arrive at the number average aspect ratio. Generally, the number average aspect ratio of the metalloid nanoparticles described herein is from about 0.9 to about 1.1, typically about 1.

The metalloid nanoparticles suitable for use according to the present disclosure may comprise boron (B), silicon (Si), germanium (Ge), arsenic (As), antimony (Sb), tellurium (Te), tin (Sn) and/or oxides thereof. Some non-limiting, specific examples of suitable metalloid nanoparticles include, but are not limited to, nanoparticles comprising $B_2O_3$, $B_2O$, $SiO_2$, SiO, $GeO_2$, GeO, $As_2O_4$, $As_2O_3$, $As_2O_5$, $Sb_2O_3$, $TeO_2$, and mixtures thereof.

In an embodiment, the non-aqueous ink composition of the present disclosure comprises one or more metalloid nanoparticles comprising $B_2O_3$, $B_2O$, $SiO_2$, SiO, $GeO_2$, GeO, $As_2O_4$, $As_2O_3$, $As_2O_5$, $SnO_2$, SnO, $Sb_2O_3$, $TeO_2$, or mixtures thereof.

In an embodiment, the non-aqueous ink composition of the present disclosure comprises one or more metalloid nanoparticles comprising Sift.

The metalloid nanoparticles may comprise one or more organic capping groups. Such organic capping groups may be reactive or non-reactive. Reactive organic capping groups are organic capping groups capable of cross-linking, for example, in the presence of UV radiation or radical initiators.

In an embodiment, the metalloid nanoparticles comprise one or more organic capping groups.

Examples of suitable metalloid nanoparticles include $SiO_2$ nanoparticles available as dispersions in various solvents, such as, for example, methyl ethyl ketone, methyl isobutyl ketone, N,N-dimethylacetamide, ethylene glycol, isopropanol, methanol, ethylene glycol monopropyl ether, and propylene glycol monomethyl ether acetate, marketed as ORGANOSILICASOL™ by Nissan Chemical.

The amount of the metalloid nanoparticles used in the non-aqueous ink composition described herein can be controlled and measured as a weight percentage relative to the combined weight of the metalloid nanoparticles and the doped or undoped polythiophene. In an embodiment, the amount of the metalloid nanoparticles is from 1 wt. % to 98 wt. %, typically from about 2 wt. to about 95 wt. %, more typically from about 5 wt. % to about 90 wt. %, still more typically about 10 wt. % to about 90 wt. %, relative to the combined weight of the metalloid nanoparticles and the doped or undoped polythiophene. In an embodiment, the amount of the metalloid nanoparticles is from about 20 wt. % to about 98 wt. %, typically from about 25 wt. to about 95 wt. %, relative to the combined weight of the metalloid nanoparticles and the doped or undoped polythiophene.

The non-aqueous ink composition of the present disclosure may optionally further comprise one or more matrix compounds known to be useful in hole injection layers (HILs) or hole transport layers (HTLs).

The optional matrix compound can be a lower or higher molecular weight compound, and is different from the polythiophene described herein. The matrix compound can be, for example, a synthetic polymer that is different from the polythiophene. See, for example, US Patent Publication No. 2006/0175582 published Aug. 10, 2006. The synthetic polymer can comprise, for example, a carbon backbone. In some embodiments, the synthetic polymer has at least one polymer side group comprising an oxygen atom or a nitrogen atom. The synthetic polymer may be a Lewis base. Typically, the synthetic polymer comprises a carbon backbone and has a glass transition temperature of greater than 25° C. The synthetic polymer may also be a semi-crystalline or crystalline polymer that has a glass transition temperature equal to or lower than 25° C. and/or a melting point greater than 25° C. The synthetic polymer may comprise one or more acidic groups, for example, sulfonic acid groups.

In an embodiment, the synthetic polymer is a polymeric acid comprising one or more repeating units comprising at least one alkyl or alkoxy group which is substituted by at least one fluorine atom and at least one sulfonic acid ($-SO_3H$) moiety, wherein said alkyl or alkoxy group is optionally interrupted by at least one ether linkage (—O—) group.

In an embodiment, the polymeric acid comprises a repeating unit complying with formula (II) and a repeating unit complying with formula (III)

(II)

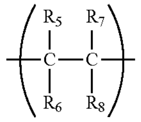

(III)

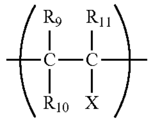

wherein each occurrence of $R_5$, $R_6$, $R_7$, $R_8$, $R_9$, $R_{10}$, and $R_{11}$ is, independently, H, halogen, fluoroalkyl, or perfluoroalkyl; and X is $—[OC(R_hR_i)—C(R_jR_k)]_q—O—[CR_lR_m]_z—SO_3H$, wherein each occurrence of $R_h$, $R_i$, $R_j$, $R_k$, $R_l$ and $R_m$ is, independently, H, halogen, fluoroalkyl, or perfluoroalkyl; q is 0 to 10; and z is 1-5.

In an embodiment, each occurrence of $R_5$, $R_6$, $R_7$, and $R_8$ is, independently, Cl or F.

In an embodiment, each occurrence of $R_5$, $R_7$, and $R_8$ is F, and $R_6$ is Cl. In an embodiment, each occurrence of $R_5$, $R_6$, $R_7$, and $R_8$ is F.

In an embodiment, each occurrence of $R_9$, $R_{10}$, and $R_{11}$ is F.

In an embodiment, each occurrence of $R_h$, $R_i$, $R_j$, $R_k$, $R_l$ and $R_m$ is, independently, F, $(C_1-C_8)$fluoroalkyl, or $(C_1-C_8)$perfluoroalkyl.

In an embodiment, each occurrence of $R_l$ and $R_m$ is F; q is 0; and z is 2.

In an embodiment, each occurrence of $R_5$, $R_7$, and $R_8$ is F, and $R_6$ is Cl; and each occurrence of $R_l$ and $R_m$ is F; q is 0; and z is 2.

In an embodiment, each occurrence of $R_5$, $R_6$, $R_7$, and $R_8$ is F; and each occurrence of $R_l$ and $R_m$ is F; q is 0; and z is 2.

The ratio of the number of repeating units complying with formula (II) ("n") to the number of the repeating units complying with formula (III) ("m") is not particularly limited. The n:m ratio is typically from 9:1 to 1:9, more typically 8:2 to 2:8. In an embodiment, the n:m ratio is 9:1. In an embodiment, the n:m ratio is 8:2.

The polymeric acid suitable for use according to the present disclosure may be synthesized using methods known to those of ordinary skill in the art or obtained from commercially-available sources. For instance, the polymers comprising a repeating unit complying with formula (II) and a repeating unit complying with formula (III) may be made by co-polymerizing monomers represented by formula (IIa) with monomers represented by formula (IIIa)

(IIa)

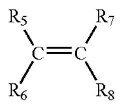

(IIIa)

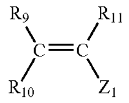

wherein $Z_1$ is $—[OC(R_hR_i)—C(R_jR_k)]_q—O—[CR_lR_m]_z—SO_2F$, wherein $R_h$, $R_i$, $R_j$, $R_k$, $R_l$ and $R_m$, q, and z are as defined herein, according to known polymerization methods, followed by conversion to sulfonic acid groups by hydrolysis of the sulfonyl fluoride groups.

For example, tetrafluoroethylene (TFE) or chlorotrifluoroethylene (CTFE) may be copolymerized with one or more fluorinated monomers comprising a precursor group for sulfonic acid, such as, for example, $F_2C{=}CF—O—CF_2—CF_2—SO_2F$; $F_2C{=}CF—[O—CF_2—CR_{12}F—O]_q—CF_2—CF_2—SO_2F$, wherein $R_{12}$ is F or $CF_3$ and q is 1 to 10; $F_2C{=}CF—O—CF_2—CF_2—CF_2—SO_2F$; and $F_2C{=}CF—OCF_2—CF_2—CF_2—CF_2—SO_2F$.

The equivalent weight of the polymeric acid is defined as the mass, in grams, of the polymeric acid per mole of acidic groups present in the polymeric acid. The equivalent weight of the polymeric acid is from about 400 to about 15,000 g polymer/mol acid, typically from about 500 to about 10,000 g polymer/mol acid, more typically from about 500 to 8,000 g polymer/mol acid, even more typically from about 500 to 2,000 g polymer/mol acid, still more typically from about 600 to about 1,700 g polymer/mol acid.

Such polymeric acids are, for instance, those marketed by E. I. DuPont under the trade name NAFION®, those marketed by Solvay Specialty Polymers under the trade name AQUIVION®, or those marketed by Asahi Glass Co. under the trade name FLEMION®.

In an embodiment, the synthetic polymer is a polyether sulfone comprising one or more repeating units comprising at least one sulfonic acid ($—SO_3H$) moiety.

In an embodiment, the polyether sulfone comprises a repeating unit complying with formula (IV)

(IV)

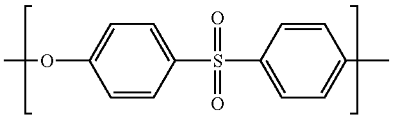

and a repeating unit selected from the group consisting of a repeating unit complying with formula (V) and a repeating unit complying with formula (VI)

(V)

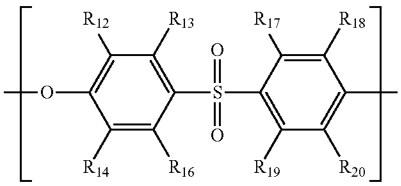

(VI)

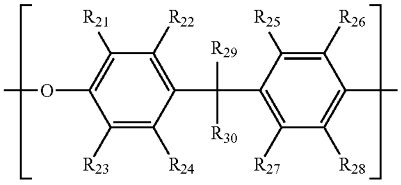

wherein $R_{12}$-$R_{20}$ are each, independently, H, halogen, alkyl, or $SO_3H$, provided that at least one of $R_{12}$-$R_{20}$ is $SO_3H$; and wherein $R_{21}$-$R_{28}$ are each, independently, H, halogen, alkyl, or $SO_3H$, provided that at least one of $R_{21}$-$R_{28}$ is $SO_3H$, and $R_{29}$ and $R_{30}$ are each H or alkyl.

In an embodiment, $R_{29}$ and $R_{30}$ are each alkyl. In an embodiment, $R_{29}$ and $R_{30}$ are each methyl.

In an embodiment, $R_{12}$-$R_{17}$, $R_{19}$, and $R_{20}$, are each H and $R_{18}$ is $SO_3H$.

In an embodiment, $R_{21}$-$R_{25}$, $R_{27}$, and $R_{28}$, are each H and $R_{26}$ is $SO_3H$.

In an embodiment, the polyether sulfone is represented by formula (VII)

(VII)

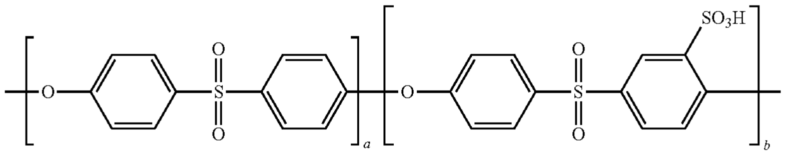

wherein a is from 0.7 to 0.9 and b is from 0.1 to 0.3.

The polyether sulfone may further comprise other repeating units, which may or may not be sulfonated.

For example, the polyether sulfone may comprise a repeating unit of formula (VIII)

(VIII)

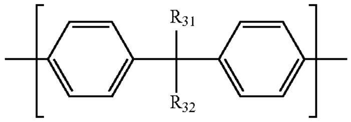

wherein $R_{31}$ and $R_{32}$ are each, independently, H or alkyl.

Any two or more repeating units described herein may together form a repeating unit and the polyether sulfone may comprise such a repeating unit. For example, the repeating unit complying with formula (IV) may be combined with a repeating unit complying with formula (VI) to give a repeating unit complying with formula (IX)

(IX)

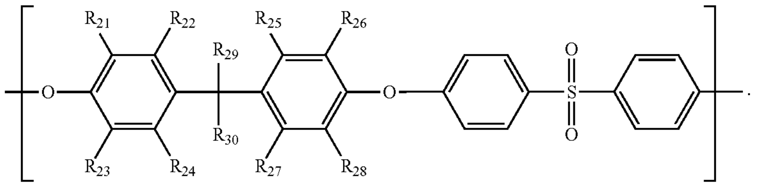

Analogously, for example, the repeating unit complying with formula (IV) may be combined with a repeating unit complying with formula (VIII) to give a repeating unit complying with formula (X)

(X)

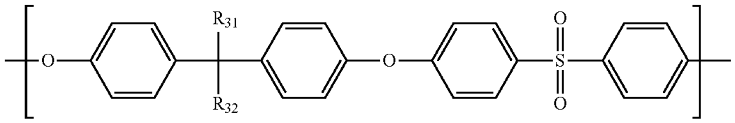

In an embodiment, the polyether sulfone is represented by formula (XI)

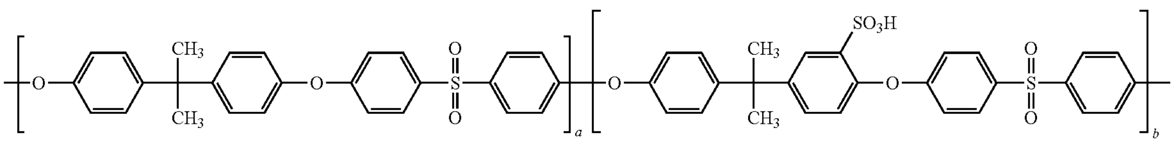

(XI)

wherein a is from 0.7 to 0.9 and b is from 0.1 to 0.3.

Polyether sulfones comprising one or more repeating units comprising at least one sulfonic acid (—$SO_3H$) moiety are commercially-available, for example, sulfonated polyether sulfones marketed as S-PES by Konishi Chemical Ind. Co., Ltd.

The optional matrix compound can be a planarizing agent. A matrix compound or a planarizing agent may be comprised of, for example, a polymer or oligomer such as an organic polymer, such as poly(styrene) or poly(styrene) derivatives; poly(vinyl acetate) or derivatives thereof; poly (ethylene glycol) or derivatives thereof; poly(ethylene-co-vinyl acetate); poly(pyrrolidone) or derivatives thereof (e.g., poly(l-vinylpyrrolidone-co-vinyl acetate)); poly(vinyl pyridine) or derivatives thereof; poly(methyl methacrylate) or derivatives thereof; poly(butyl acrylate); poly(aryl ether ketones); poly(aryl sulfones); poly(esters) or derivatives thereof; or combinations thereof.

In an embodiment, the matrix compound is poly(styrene) or poly(styrene) derivative.

In an embodiment, the matrix compound is poly(4-hydroxystyrene).

The optional matrix compound or planarizing agent may be comprised of, for example, at least one semiconducting matrix component. The semiconducting matrix component is different from the polythiophene described herein. The semiconducting matrix component can be a semiconducting small molecule or a semiconducting polymer that is typically comprised of repeat units comprising hole carrying units in the main-chain and/or in a side-chain. The semiconducting matrix component may be in the neutral form or may be doped, and is typically soluble and/or dispersible in organic solvents, such as toluene, chloroform, acetonitrile, cyclohexanone, anisole, chlorobenzene, o-dichlorobenzene, ethyl benzoate and mixtures thereof.

The amount of the optional matrix compound can be controlled and measured as a weight percentage relative to the amount of the doped or undoped polythiophene. In an embodiment, the amount of the optional matrix compound is from 0 to 99.5 wt. %, typically from about 10 wt. to about 98 wt. %, more typically from about 20 wt. % to about 95 wt. %, still more typically about 25 wt. % to about 45 wt. %, relative to the amount of the doped or undoped polythiophene. In the embodiment with 0 wt. %, the ink composition is free of matrix compound.

The ink compositions of the present disclosure are non-aqueous. As used herein, "non-aqueous" means that the total amount of water present in the ink compositions of the present disclosure is from 0 to 5% wt., with respect to the total amount of the liquid carrier. Typically, the total amount of water in the ink composition is from 0 to 2% wt, more typically from 0 to 1% wt, even more typically from 0 to 0.5% wt, with respect to the total amount of the liquid carrier. In an embodiment, the ink composition of the present disclosure is free of any water.

The non-aqueous ink compositions of the present disclosure may optionally comprise one or more amine compounds. Suitable amine compounds for use in the non-aqueous ink compositions of the present disclosure include, but are not limited to, ethanolamines and alkylamines.

Examples of suitable ethanolamines include dimethylethanol amine [$(CH_3)_2NCH_2CH_2OH$], triethanol amine [$N(CH_2CH_2OH)_3$], and N-tert-Butyldiethanol amine [$t\text{-}C_4H_9N(CH_2CH_2OH)_2$].

Alkylamines include primary, secondary, and tertiary alkylamines. Examples of primary alkylamines include, for example, ethylamine [$C_2H_5NH_2$], n-butylamine [$C_4H_9NH_2$], t-butylamine [$C_4H_9NH_2$], n-hexylamine [$C_6H_{13}NH_2$], n-decylamine[$C_{10}H_{21}NH_2$], and ethylenediamine [$H_2NCH_2CH_2NH_2$]. Secondary alkylamines include, for example, diethylamine [$(C_2H_5)_2NH$], di(n-propylamine) [$(n\text{-}C_3H_9)_2NH$], di(iso-propylamine) [$(i\text{-}C_3H_9)_2NH$], and dimethyl ethylenediamine [$CH_3NHCH_2CH_2NHCH_3$]. Tertiary alkylamines include, for example, trimethylamine [$(CH_3)_3N$], triethylamine [$(C_2H_5)_3N$], tri(n-butyl)amine [$(C_4H_9)_3N$], diethylmethyl amine [$(C_2H_5)_2NCH_3$], dimethylethyl amine [$(CH_3)_2NC_2H_5$], and tetramethyl ethylenediamine [$(CH_3)_2NCH_2CH_2N(CH_3)_2$].

In an embodiment, the amine compound is a tertiary alkylamine. In an embodiment, the amine compound is triethylamine.

The amount of the amine compound can be controlled and measured as a weight percentage relative to the total amount of the ink composition. In an embodiment, the amount of the amine compound is at least 0.01 wt. %, at least 0.10 wt. %, at least 1.00 wt. %, at least 1.50 wt. %, or at least 2.00 wt. %, with respect to the total amount of the ink composition. In an embodiment, the amount of the amine compound is from about 0.01 to about 2.00 wt. %, typically from about 0.05% wt. to about 1.50 wt. %, more typically from about 0.1 wt. % to about 1.0 wt. %, with respect to the total amount of the ink composition.

The liquid carrier used in the ink composition according to the present disclosure comprises one or more organic solvents. In an embodiment, the ink composition consists essentially of or consists of one or more organic solvents. The liquid carrier may be an organic solvent or solvent blend comprising two or more organic solvents adapted for use and processing with other layers in a device, such as the anode or light emitting layer.

Organic solvents suitable for use in the liquid carrier include, but are not limited to, aliphatic and aromatic ketones, organosulfur solvents, such as dimethyl sulfoxide (DMSO) and 2,3,4,5-tetrahydrothiophene-1,1-dioxide (tetramethylene sulfone; Sulfolane), tetrahydrofuran (THF), tetrahydropyran (THP), tetramethyl urea (TMU), N,N'-dimethylpropyleneurea, alkylated benzenes, such as xylene and isomers thereof, halogenated benzenes, N-methylpyrrolidinone (NMP), dimethylformamide (DMF), dimethylacetamide (DMAc), dichloromethane, acetonitrile, dioxanes, ethyl acetate, ethyl benzoate, methyl benzoate, dimethyl carbonate, ethylene carbonate, propylene carbonate, 3-methoxypropionitrile, 3-ethoxypropionitrile, or combinations thereof.

Aliphatic and aromatic ketones include, but are not limited to, acetone, acetonyl acetone, methyl ethyl ketone (MEK), methyl isobutyl ketone, methyl isobutenyl ketone, 2-hexanone, 2-pentanone, acetophenone, ethyl phenyl ketone, cyclohexanone, and cyclopentanone. In some embodiments, ketones with protons on the carbon located alpha to the ketone are avoided, such as cyclohexanone, methyl ethyl ketone, and acetone.

Other organic solvents might also be considered that solubilize, completely or partially, the polythiophene polymer or that swell the polythiophene polymer. Such other solvents may be included in the liquid carrier in varying quantities to modify ink properties such as wetting, viscosity, morphology control. The liquid carrier may further comprise one or more organic solvents that act as non-solvents for the polythiophene polymer.

Other organic solvents suitable for use according to the present disclosure include ethers such as anisole, ethoxybenzene, dimethoxy benzenes and glycol ethers, such as, ethylene glycol diethers, such as 1,2-dimethoxyethane, 1,2-diethoxyethane, and 1,2-dibutoxyethane; diethylene glycol diethers such as diethylene glycol dimethyl ether, and diethylene glycol diethyl ether; propylene glycol diethers such as propylene glycol dimethyl ether, propylene glycol diethyl ether, and propylene glycol dibutyl ether; dipropylene glycol diethers, such as dipropylene glycol dimethyl ether, dipropylene glycol diethyl ether, and dipropylene glycol dibutyl ether; as well as higher analogues (i.e., tri- and tetra-analogues) of the ethylene glycol and propylene glycol ethers mentioned herein, such as triethylene glycol dimethyl ether, triethylene glycol butyl methyl ether and tetraethylene glycol dimethyl ether.

Still other solvents can be considered, such as ethylene glycol monoether acetates and propylene glycol monoether acetates (glycol ester ethers), wherein the ether can be selected, for example, from methyl, ethyl, n-propyl, isopropyl, n-butyl, sec-butyl, tert-butyl, and cyclohexyl. Higher glycol ether analogues of the above list, such as di-, tri- and tetra-, are also included.

Examples include, but are not limited to, propylene glycol methyl ether acetate, 2-ethoxyethyl acetate, 2-butoxyethyl acetate, ethylene glycol monomethyl ether acetate and diethylene glycol monomethyl ether acetate.

Still other solvents can be considered, such as ethylene glycol diacetate (glycol diesters). Higher glycol ether analogues, such as di-, tri- and tetra-, are also included.

Examples include, but are not limited to, ethylene glycol diacetate, triethylene glycol diacetate and propylene glycol diacetate.

Alcohols may also be considered for use in the liquid carrier, such as, for example, methanol, ethanol, trifluoroethanol, n-propanol, isopropanol, n-butanol, and t-butanol, diols, such as, for example, ethylene glycol, diethylene glycol, propylene glycol, 1,3-butanediol, and 1,4-butanediol; and alkylene glycol monoethers (glycol monoethers). Examples of suitable glycol monoethers include, but are not limited to, ethylene glycol monopropyl ether, ethylene glycol monohexyl ether (hexyl Cellosolve), propylene glycol monobutyl ether (Dowanol PnB), diethylene glycol monoethyl ether (ethyl Carbitol), dipropylene glycol n-butyl ether (Dowanol DPnB), diethylene glycol monophenyl ether (phenyl Carbitol), ethylene glycol monobutyl ether (butyl Cellosolve), diethylene glycol monobutyl ether (butyl Carbitol), dipropylene glycol monomethyl ether (Dowanol DPM), diisobutyl carbinol, 2-ethylhexyl alcohol, methyl isobutyl carbinol, ethylene glycol monophenyl ether (Dowanol Eph), propylene glycol monopropyl ether (Dowanol PnP), propylene glycol monophenyl ether (Dowanol PPh), diethylene glycol monopropyl ether (propyl Carbitol), diethylene glycol monohexyl ether (hexyl Carbitol), 2-ethylhexyl carbitol, dipropylene glycol monopropyl ether (Dowanol DPnP), tripropylene glycol monomethyl ether (Dowanol TPM), diethylene glycol monomethyl ether (methyl Carbitol), and tripropylene glycol monobutyl ether (Dowanol TPnB).

As disclosed herein, the organic solvents disclosed herein can be used in varying pro-portions in the liquid carrier, for example, to improve the ink characteristics such as substrate wettability, ease of solvent removal, viscosity, surface tension, and jettability.

In some embodiments, the use of aprotic non-polar solvents can provide the additional benefit of increased lifetimes of devices with emitter technologies which are sensitive to protons, such as, for example, PHOLEDs.

In an embodiment, the liquid carrier comprises 1,3-butanediol, acetonitrile, 3-methoxypropionitrile, dimethyl sulfoxide, ethylene glycol (glycols), tetramethyl urea, or a mixture thereof.

Examples of suitable glycols include, but are not limited to, ethylene glycol, diethylene glycol, dipropylene glycol, polypropylene glycol, propylene glycol and triethylene glycol.

The above-mentioned glycol ethers, glycol ester ethers, glycol diesters, glycol monoethers and glycols are collectively referred to as “glycol-based solvents”.

In an embodiment, the liquid carrier consists of (A) one or more glycol-based solvents.

In an embodiment, the liquid carrier comprises (A) one or more glycol-based solvents and (B) one or more organic solvents other than the glycol-based solvents.

In an embodiment, the liquid carrier comprises one or more glycol-based solvents and (B') one or more organic solvents other than the glycol-based solvents, tetramethylurea and dimethylsulfoxide.

As examples of preferred glycol-based solvents (A), there can be mentioned glycol ethers, glycol monoethers and glycols which can be used in combination.

Examples include, but are not limited to, a mixture of a glycol ether and a glycol.

As specific examples, there can be mentioned specific examples of the above-mentioned glycol ethers and glycols. Examples of preferred glycol ethers include triethylene glycol dimethyl ether and triethylene glycol butyl methyl ether. Examples of preferred glycols include ethylene glycol and diethylene glycol.

As examples of the above-mentioned organic solvents (B), there can be mentioned nitriles, alcohols, aromatic ethers and aromatic hydrocarbons.

Examples include, but are not limited to, methoxypropionitrile and ethoxypropionitrile as the nitriles; benzylalcohol and 2-(benzyloxy)ethanol as the alcohols; methylanisole, dimethylanisole, ethylanisole, butyl phenyl ether, butylanisole, pentylanisole, hexylanisole, heptylanisole, octylanisole and phenoxytoluene as the aromatic ethers; and pentylbenzene, hexylbenzene, heptylbenzene, octylbenzene, nonylbenzene, cyclo-hexylbenzene and tetralin as the aromatic hydrocarbons.

It is preferred that the proportion by weight (wtA) of the above-mentioned glycol-based solvent (A) and the proportion by weight (wtB) of the above-mentioned organic solvent (B) satisfy the relationship represented by the following formula (1-1), more preferably the following formula (1-2), most preferably the following formula (1-3).

$$0.05 \leq wtB/(wtA+wtB) \leq 0.50 \quad (1\text{-}1)$$

$$0.10 \leq wtB/(wtA+wtB) \leq 0.40 \quad (1\text{-}2)$$

$$0.15 \leq wtB/(wtA+wtB) \leq 0.30 \quad (1\text{-}3)$$

When the composition of the present invention contains 2 or more glycol-based solvent (A), wtA represents the total proportion by weight of the glycol-based solvents (A) and, when the composition of the present invention contains 2 or more organic solvent (B), wtB represents the total proportion by weight of the organic solvent (B).

It is preferred that the proportion by weight (wtA) of the above-mentioned glycol-based solvent (A) and the proportion by weight (wtB') of the above-mentioned organic solvent (B') satisfy the relationship represented by the following formula (1-1), more preferably the following formula (1-2), most preferably the following formula (1-3).

$$0.05 \leq wtB'/(wtA+wtB') \leq 0.50 \quad (1\text{-}1)$$

$$0.10 \leq wtB'/(wtA+wtB') \leq 0.40 \quad (1\text{-}2)$$

$$0.15 \leq wtB'/(wtA+wtB') \leq 0.30 \quad (1\text{-}3)$$

When the composition of the present invention contains 2 or more glycol-based solvent (A), wtA represents the total proportion by weight of the glycol-based solvents (A) and, when the composition of the present invention contains 2 or more organic solvent (B'), wtB' represents the total proportion by weight of the organic solvent (B').

The amount of liquid carrier in the ink composition according to the present disclosure is from about 50 wt. % to about 99 wt. %, typically from about 75 wt. % to about 98 wt. %, still more typically from about 90 wt. % to about 95 wt. %, with respect to the total amount of ink composition.

The total solids content (% TS) in the ink composition according to the present disclosure is from about 0.1 wt. % to about 50 wt. %, typically from about 0.3 wt. % to about 40 wt. %, more typically from about 0.5 wt. % to about 15 wt. %, still more typically from about 1 wt. % to about 5 wt. %, with respect to the total amount of ink composition.

The non-aqueous ink compositions described herein may be prepared according to any suitable method known to the ordinarily-skilled artisan. For example, in one method, an initial aqueous mixture is prepared by mixing an aqueous dispersion of the polythiophene described herein with an aqueous dispersion of polymeric acid, if desired, another matrix compound, if desired, and additional solvent. The solvents, including water, in the mixture are then removed, typically by evaporation. The resulting dry product is then dissolved or dispersed in one or more organic solvents, such as dimethyl sulfoxide, and filtered under pressure to yield a non-aqueous mixture. An amine compound may optionally be added to such non-aqueous mixture. The non-aqueous mixture is then mixed with a non-aqueous dispersion of the metalloid nanoparticles to yield the final non-aqueous ink composition.

In another method, the non-aqueous ink compositions described herein may be prepared from stock solutions. For example, a stock solution of the polythiophene described herein can be prepared by isolating the polythiophene in dry form from an aqueous dispersion, typically by evaporation. The dried polythiophene is then combined with one or more organic solvents and, optionally, an amine compound. If desired, a stock solution of the polymeric acid described herein can be prepared by isolating the polymeric acid in dry form from an aqueous dispersion, typically by evaporation, freeze drying, or spray drying. The dried polymeric acid is then combined with one or more organic solvents. Stock solutions of other optional matrix materials can be made analogously. Stock solutions of the metalloid nanoparticles can be made, for example, by diluting commercially-available dispersions with one or more organic solvents, which may be the same or different from the solvent or solvents contained in the commercial dispersion. Desired amounts of each stock solution are then combined to form the non-aqueous ink compositions of the present disclosure.

Still in another method, the non-aqueous ink compositions described herein may be prepared by isolating the individual components in dry form as described herein, but instead of preparing stock solutions, the components in dry form are combined and then dissolved in one or more organic solvents to provide the NQ ink composition.

The ink composition according to the present disclosure can be cast and annealed as a film on a substrate.

Thus, the present disclosure also relates to a process for forming a hole-carrying film, the process comprising:

1) coating a substrate with a non-aqueous ink composition disclosed herein; and
2) annealing the coating on the substrate, thereby forming the hole-carrying film.

The coating of the ink composition on a substrate can be carried out by methods known in the art including, for example, spin casting, spin coating, dip casting, dip coating, slot-dye coating, ink jet printing, gravure coating, doctor blading, and any other methods known in the art for fabrication of, for example, organic electronic devices.

The substrate can be flexible or rigid, organic or inorganic. Suitable substrate compounds include, for example, glass, including, for example, display glass, ceramic, metal, and plastic films.

As used herein, the term "annealing" refers to any general process for forming a hardened layer, typically a film, on a substrate coated with the non-aqueous ink composition of the present disclosure. General annealing processes are known to those of ordinary skill in the art. Typically, the solvent is removed from the substrate coated with the non-aqueous ink composition. The removal of solvent may be achieved, for example, by subjecting the coated substrate to pressure less than atmospheric pressure, and/or by heating the coating layered on the substrate to a certain temperature (annealing temperature), maintaining the temperature for a certain period of time (annealing time), and then allowing the resulting layer, typically a film, to cool to room temperature.

The step of annealing can be carried out by heating the substrate coated with the ink composition using any method known to those of ordinary skill in the art, for example, by heating in an oven or on a hot plate. Annealing can be carried out under an inert environment, for example, nitrogen atmosphere or noble gas atmosphere, such as, for example, argon gas. Annealing may be carried out in air atmosphere.

Without wishing to be bound by theory, it is believed that the addition of the transition metal complex thermally stabilizes the polythiophene comprising a repeating unit complying with formula (I), thereby facilitating high temperature baking, for example, at temperatures exceeding 300° C.

In an embodiment, the annealing temperature is from about 25° C. to about 330° C., typically about 150° C. to about 320° C., even more typically from about 230° C. to about 300° C., still more typically from about 230° C. to about 275° C.

The annealing time is the time for which the annealing temperature is maintained. The annealing time is from about 3 to about 40 minutes, typically from about 15 to about 30 minutes.

In an embodiment, the annealing temperature is from about 25° C. to about 330° C., typically about 150° C. to about 320° C., even more typically from about 230° C. to about 300° C., still more typically from about 230° C. to about 275° C., and the annealing time is from about 3 to about 40 minutes, typically for about 15 to about 30 minutes.

The present disclosure relates to the hole-carrying film formed by the process described herein.

Transmission of visible light is important, and good transmission (low absorption) at higher film thicknesses is particularly important. For example, the film made according to the process of the present disclosure can exhibit a transmittance (typically, with a substrate) of at least about 85%, typically at least about 90%, of light having a wavelength of about 380-800 nm. In an embodiment, the transmittance is at least about 90%.

In one embodiment, the film made according to the process of the present disclosure has a thickness of from about 5 nm to about 500 nm, typically from about 5 nm to about 150 nm, more typically from about 30 nm to 120 nm.

In an embodiment, the film made according to the process of the present disclosure exhibits a transmittance of at least about 90% and has a thickness of from about 5 nm to about 500 nm, typically from about 5 nm to about 150 nm, more typically from about 30 nm to 120 nm. In an embodiment, the film made according to the process of the present disclosure exhibits a transmittance (% T) of at least about 90% and has a thickness of from about 30 nm to 120 nm.

The films made according to the processes of the present disclosure may be made on a substrate optionally containing an electrode or additional layers used to improve electronic properties of a final device. The resulting films may be intractable to one or more organic solvents, which can be the solvent or solvents used as liquid carrier in the ink for subsequently coated or deposited layers during fabrication of a device. The films may be intractable to, for example, toluene, which can be the solvent in the ink for subsequently coated or deposited layers during fabrication of a device.

The work function of the hole-carrying film according to the present disclosure is at least 0.01 eV, at least 0.10 eV, at least 0.15 eV, at least 0.20 eV, at least 0.25 eV, or at least 0.30 eV greater than the corresponding hole-carrying film free of the transition metal complex having at least one β-diketonate ligand, as measured by the PESA-AC2 method.

As used herein, and as would be generally understood by the ordinarily-skilled artisan, "HOMO" refers to highest occupied molecular orbital and "LUMO" refers to lowest unoccupied molecular orbital. A first HOMO or LUMO energy level is greater than or higher than a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. Likewise, work function is measured as a negative energy relative to the vacuum level, i.e., a higher work function corresponds to a smaller absolute value (less negative).

Herein, however, HOMO energy, LUMO energy, and work function are reported as absolute values. Thus, "increasing" the work function, for example, means increasing the absolute value of the work function, and corresponds to the work function being more negative, deeper, or farther away from the vacuum level. Accordingly, the phrase "greater than" with reference to the work function (as well as HOMO and LUMO energies) means that the work function is more negative in comparison.

The work function of films made from the NQ inks described herein may be determined by methods and apparatuses known to those of ordinary skill in the art. For example, the "Photo-Electron Spectroscopy in Air" (PESA) AC-2 instrument, available from Riken Keiki Co. Ltd. (Japan) may be used. Generally, the PESA AC-2 method involves measuring the energy of UV photons at which photoelectron emission occurs from the sample surface. The energy of UV photons is scanned within a pre-determined range, typically, from 4.2 eV to 6.2 eV. When the energy of UV photons approaches the work function or HOMO of the sample material, photoelectron emission occurs from the sample surface. The photoelectrons are detected and counted. For semiconductors, the relationship between the photon energy and the cube root of photoelectron yield is a straight line. The crossing point of the background line and the yield line is the photoemission threshold energy.

In an embodiment, the work function of the hole-carrying film according to the present disclosure is greater than 5.36 eV, typically greater than 5.45 eV, as measured by the PESA-AC2 method.

In an embodiment, the work function of the hole-carrying film according to the present disclosure is from about 5.36 eV to about 5.70 eV, typically from about 5.45 eV to about 5.60 eV.

The present disclosure also relates to a device comprising a film prepared according to the processes described herein. The devices described herein can be made by methods known in the art including, for example, solution processing. Inks can be applied and solvents removed by standard methods. The film prepared according to the processes described herein may be an HIL and/or HTL layer in the device.

Methods are known in the art and can be used to fabricate organic electronic devices including, for example, OLED and OPV devices. Methods known in the art can be used to measure brightness, efficiency, and lifetimes. Organic light emitting diodes (OLED) are described, for example, in U.S. Pat. Nos. 4,356,429 and 4,539,507 (Kodak). Conducting polymers which emit light are described, for example, in U.S. Pat. Nos. 5,247,190 and 5,401,827 (Cambridge Display Technologies). Device architecture, physical principles, solution processing, multilayering, blends, and compounds synthesis and formulation are described in Kraft et al., "Electroluminescent Conjugated Polymers-Seeing Polymers in a New Light," Angew. Chem. Int. Ed., 1998, 37, 402-428, which is hereby incorporated by reference in its entirety.

Light emitters known in the art and commercially available can be used including various conducting polymers as well as organic molecules, such as compounds available from Sumation, Merck Yellow, Merck Blue, American Dye Sources (ADS), Kodak (e.g., ALQ3 and the like), and even Aldrich, such as BEHP-PPV. Examples of such organic electroluminescent compounds include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) poly(p-phenylene) and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes, such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers, such as poly(p-phenylene-2,6-benzobisthiazole), poly(p-phenylene-2,6-benzobisoxazole), poly(p-phenylene-2,6-benzimidazole), and their derivatives;

(xv) polyfluorene polymers and co-polymers with polyfluorene units.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent compounds include: (i) tris(8-hydroxyquinolinato) aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis(2-methyl-8-hydroxyquinolinato) aluminum; (v) bis(hydroxybenzoquinolinato) beryllium ($BeQ_2$); (vi) bis(diphenylvinyl)biphenylene (DPVBI); and (vii) arylamine-substituted distyrylarylene (DSA amine).

Such polymer and small-molecule compounds are well known in the art and are described in, for example, U.S. Pat. No. 5,047,687.

The devices can be fabricated in many cases using multilayered structures which can be prepared by, for example, solution or vacuum processing, as well as printing and patterning processes. In particular, use of the embodiments described herein for hole injection layers (HILs), wherein the composition is formulated for use as a hole injection layer, can be carried out effectively.

Examples of HIL in devices include:

1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV;

3) Channel material in transistors;

4) Channel material in circuits comprising a combination of transistors, such as logic gates;

5) Electrode material in transistors;

6) Gate layer in a capacitor;

7) Chemical sensor where modification of doping level is achieved due to association of the species to be sensed with the conductive polymer;

8) Electrode or electrolyte material in batteries.

A variety of photoactive layers can be used in OPV devices. Photovoltaic devices can be prepared with photoactive layers comprising fullerene derivatives mixed with, for example, conducting polymers as described in, for example, U.S. Pat. Nos. 5,454,880; 6,812,399; and 6,933,436. Photoactive layers may comprise blends of conducting polymers, blends of conducting polymers and semiconducting nanoparticles, and bilayers of small molecules such as pthalocyanines, fullerenes, and porphyrins.

Common electrode compounds and substrates, as well as encapsulating compounds can be used.

In one embodiment, the cathode comprises Au, Ca, Al, Ag, or combinations thereof. In one embodiment, the anode comprises indium tin oxide. In one embodiment, the light emission layer comprises at least one organic compound.

Interfacial modification layers, such as, for example, interlayers, and optical spacer layers may be used.

Electron transport layers can be used.

In an embodiment, the device according to the present disclosure is an OLED, OPV, transistor, capacitor, sensor, transducer, drug release device, electrochromic device, or battery device.

In an embodiment, the device is an OLED further comprising a hole transport layer.

In another embodiment, the hole transport layer comprises tris(4-carbazoyl-9-ylphenyl)amine.

The present disclosure further relates to the use of a transition metal complex having at least one β-diketonate ligand to increase the work function of a hole-carrying film in an organic light emitting device, wherein the hole-carrying film comprises a polythiophene comprising a repeating unit complying with formula (I), as described herein.

In an embodiment, the work function of the hole-carrying film is increased by at least 0.01 eV, at least 0.10 eV, at least 0.15 eV, at least 0.20 eV, at least 0.25 eV, or at least 0.30 eV when compared to the corresponding hole-carrying film free of transition metal complex having at least one β-diketonate ligand, as measured by the PESA-AC2 method.

The inks, methods and processes, films, and devices according to the present disclosure are further illustrated by the following non-limiting examples.

EXAMPLES

The components used in the following examples are summarized in the following Table 1.

TABLE 1

| Summary of components | |
|---|---|
| S-poly(3-MEET) | Sulfonated poly(3-MEET) |
| TFE-VEFS 1 | TFE/perfluoro-2-(vinyloxy)ethane-1-sulfonic acid copolymer having equivalent weight of 676 g polymer/mol acid (available from Solvay as AQUIVION ® D66-20BS); n:m = 8:2 |
| $MoO_2(acac)_2$ | Bis(acetylacetonato)dioxomolybdenum(VI) |
| TEA | Triethylamine |
| EG-ST | 20-21 wt % silica ($SiO_2$) dispersion in ethylene glycol (ORGANOSILICASOL ™ EG-ST, available from Nissan Chemical) |
| BDO | 1,3-Butanediol |
| ACN | Acetonitrile |
| EG | Ethylene glycol |
| PCN | 3-Methoxypropionitrile |

Example 1. Preparation of Base NQ Inks

S-poly(3-MEET) amine adduct was prepared by mixing 500 g of an aqueous dispersion of S-poly(3-MEET) (0.598% solids in water), with 0.858 g of TEA. The resulting mixture was rotary-evaporated to dryness, and then further dried in a vacuum oven at 50° C. overnight. The product was isolated as 3.8 g of black powder and stored under inert atmosphere in a glovebox.

A base non-aqueous (NQ) ink, designated NQ ink 1, was prepared by combining 0.434 g of solid S-poly(3-MEET) amine adduct with 31.53 g of BDO, 47.29 g PCN, 9.55 g ACN, 5.05 g EG and 1.12 g of TEA. This combination was mixed for 30 minutes on a stir plate at ambient temperature. Next, 0.30 g of TFE-VEFS 1 was dissolved in 14.70 g of ACN by stirring at 70° C. for 20 minutes. The TFE-VEFS 1 solution was added to the S-poly(3-MEET) amine adduct mixture followed by stirring at ambient temperature for 1 hour. 15.04 g EG-ST was added and stirring continued for 1 hour to produce a clear dark blue ink. The ink was filtered through a 0.22 μm polypropylene filter before use.

Another base NQ ink, designated NQ ink 2, was also prepared according to the same procedure, except that the amount of solids and solvents were modified. The compositions of NQ inks 1 and 2 are summarized in Table 2.

TABLE 2

Base NQ inks

| Component | NQ ink 1 Composition, % | NQ ink 2 Composition, % |
|---|---|---|
| S-poly(3-MEET) amine adduct | 0.35 (solids) | 1.08 (solids) |
| TFE-VEFS 1 | 0.24 (solids) | 0.48 (solids) |
| $SiO_2$ | 2.49 (solids) | 10.44 (solids) |
| TEA | 0.97 | 0.88 |
| BOO | 25.21 | — |
| ACN | 19.40 | — |
| EG | 13.54 | 87.12 |
| PCN | 37.80 | — |

Example 2. Preparation of Inventive NQ Inks

NQ ink 1 was used as the base ink in preparing the inventive NQ inks.

0.307 g $MoO_2(acac)_2$ was added to 30.0 g of NQ ink 1 prepared according to Example 1. After stirring for 1 hour at ambient temperature, the dark blue ink was filtered through a 0.22 μm polypropylene filter to yield NQ ink 3. 0.307 g $MoO_2(acac)_2$ corresponds to 0.135 g $MoO_3$, which is 15 wt % relative to the total weight of solids (i.e., 0.9 g) in the base NQ ink used.

Two other inventive inks, NQ ink 4 and NQ ink 5, were prepared according to the same procedure, except that the amount of $MoO_2(acac)_2$ (and thus $MoO_3$ equivalent) used was modified. The amount of $MoO_3$ equivalent in NQ inks 3-5 are summarized in Table 3.

TABLE 3

Amount of $MoO_3$ in NQ inks

| | Amount of $MoO_3$ in HIL ink |
|---|---|
| NQ ink 1 | 0 |
| NQ ink 2 | 0 |
| NQ ink 3 | 15 |
| NQ ink 4 | 10 |
| NQ ink 5 | 5 |

Example 3. Film Formation and Properties

Films were formed by spin-coating using a Laurell spin coater at 3000 rpm for 90 seconds. On a hot plate, the films were flash annealed at 75° C. for 3 minutes in air, and then finally annealed under nitrogen atmosphere at a temperature of from 230° C. to 300° C. for 30 minutes.

The work function of films made from NQ inks 1-5 were determined using the "Photo-Electron Spectroscopy in Air" (PESA) system AC-2 apparatus, available from Riken Keiki Co. Ltd. (Japan). The test sample was mounted on the sample holder in dry air which was kept at earth potential. The dry air was supplied at constant pressure to the measurement chamber through the mist separator and the micro mist separator, a membrane air dryer and controlled by a pressure meter. The monochromatized UV beam from the deuterium lamp (constant intensity of 50 nW) was focused on the sample surface. The energy of UV photons was scanned from 4.2 eV to 6.2 eV with a step of 0.05 eV. When the energy of UV photons approaches the work function or Highest Occupied Molecular Orbital (HOMO) of the sample material, the photo-electron emission occurs from the sample surface. Photoelectrons were detected and counted by the open counter. The relationship between the photon energy and the cube root of photoelectron yield was a straight line. The crossing point of the background line and the yield line is the photoemission threshold energy. The slope of the (photoelectron yield)$^{1/3}$ plotted against excitation energy was calculated using Origin software.

The work function, in electron volts (eV), of the films made from NQ inks 1-5 are summarized in Table 4.

TABLE 4

| Work function of films made from NQ inks 1-5 | |
|---|---|
| Ink | Work function (eV) |
| NQ ink 1 | 5.31 |
| NQ ink 2 | 5.35 |
| NQ ink 3 | 5.59 |
| NQ ink 4 | 5.53 |
| NQ ink 5 | 5.47 |

FIG. 1 shows the work function of films made from NQ inks 1 and 3-5 (squares) as a function of $MoO_3$ concentration, which is expressed as wt % relative to the total weight of the other solids in the respective ink. As shown in FIG. 1, the work function may be tuned according to the amount of $MoO_2(acac)_2$ in the NQ ink used to make the film.

Alternatively, the $MoO_2(acac)_2$ may be added to the EG-ST dispersion used to make the base NQ ink to arrive at the inventive NQ inks. FIG. 1 shows the work function of films made in this manner (triangles) and shows that the work function tuning effect is not lost by this modification.

Example 4. Unipolar (Hole Only) Device Fabrication and Testing

The unipolar, single charge-carrier devices described herein were fabricated on indium tin oxide (ITO) surfaces deposited on glass substrates. The ITO surface was prepatterned to define the pixel area of 0.09 $cm^2$. Before depositing an HIL ink composition on the substrates, preconditioning of the substrates was performed. The device substrates were first cleaned by ultrasonication in various solutions or solvents. The device substrates were ultrasonicated in a dilute soap solution, followed by distilled water, then acetone, and then isopropanol, each for about 20 minutes. The substrates were dried under nitrogen flow. Subsequently, the device substrates were then transferred to a vacuum oven set at 120° C. and kept under partial vacuum (with nitrogen purging) until ready for use. The device substrates were treated in a UV-Ozone chamber operating at 300 W for 20 minutes immediately prior to use.

Before the HIL ink composition is deposited onto an ITO surface, filtering of the ink composition through a polypropylene 0.22-μm filter was performed.

The HILs were spin-coated in air, flash annealed at a lower temperature in air, then transferred to glove box (inert atmosphere) and annealed at a final desired temperature to remove solvents. Substrates with HIL are not exposed to air afterwards and used immediately for device fabrication. The substrates can be stored in glove box under inert atmosphere and reannealed right before device fabrication.

The substrates comprising the inventive HIL layers were transferred to a vacuum chamber where the remaining layers of the device stack were deposited by means of physical vapor deposition.

Two hole-only devices, designated device A and B, were fabricated to evaluate HILs made from the inventive NQ inks. HILs made from NQ ink 2, as a comparative example, and NQ inks 3 and 5 were tested in both device A and device B.

Device A was made by depositing N,N'-bis(1-naphtalenyl)-N,N'-bis(phenyl)benzidine (NPB) as a hole transport layer on top of the HIL followed by an aluminum (Al) cathode.

Device B was made by depositing tris(4-carbazoyl-9-ylphenyl)amine (TCTA) as a hole transport layer on top of the HIL followed by N,N'-bis(1-naphtalenyl)-N,N'-bis(phenyl)benzidine (NPB) as another hole transport layer, and then an aluminum (Al) cathode.

The respective device stacks, with respective layer thickness, are summarized in Tables 5 and 6. The coating thickness was measured by a profilometer (Veeco Instruments, Model Dektak 150) and reported as the average of three readings.

TABLE 5

| Device A | | |
|---|---|---|
| Layer | Thickness (nm) | Note |
| Al | 100 | |
| NPB | 150 | HOMO 5.4 eV |
| HIL | ~70 | |
| ITO | 50 | |

TABLE 6

| Device B | | |
|---|---|---|
| Layer | Thickness (nm) | Note |
| Al | 100 | |
| NPB | 100 | HOMO 5.4 eV |
| TCTA | 50 | HOMO 5.65 eV |
| HIL | ~70 | |
| ITO | 50 | |

Two vapor HTLs with different HOMO (NPB as shallow HOMO HTL and TCTA as deep HOMO HTL) were tested and compared.

FIG. 2 shows the current density vs. voltage comparison between HILs made from NQ ink 2 and NQ ink 3 in each of device A and B. As shown in FIG. 2, the HIL having the shallow work function (HIL from NQ ink 2) does not perform well with deep HOMO HTL (TCTA) while the HIL having the deep work function (HIL from NQ ink 3) does perform well with TCTA. Both HILs perform well with the shallow HOMO HTL (NPB).

FIG. 3 shows the voltage vs. time comparison between HILs made from NQ ink 2 and NQ ink 3 in each of device A and B. As shown in FIG. 3, the HIL having the shallow work function (HIL from NQ ink 2) does not perform well with deep HOMO HTL (TCTA) while the HIL having the deep work function (HIL from NQ ink 3) does perform well with TCTA. Both HILs perform well with the shallow HOMO HTL (NPB).

FIG. 4 shows the current density vs. voltage comparison between HILs made from NQ ink 2 and NQ ink 5 in each of device A and B. As shown in FIG. 4, the HIL having the shallow work function (HIL from NQ ink 2) does not perform well with deep HOMO HTL (TCTA) while the HIL having the deep work function (HIL from NQ ink 5) does perform well with TCTA. Both HILs perform well with the shallow HOMO HTL (NPB).

FIG. 5 shows the voltage vs. time comparison between HILs made from NQ ink 2 and NQ ink 5 in each of device A and B. As shown in FIG. 5, the HIL having the shallow work function (HIL from NQ ink 2) does not perform well with deep HOMO HTL (TCTA) while the HIL having the deep work function (HIL from NQ ink 3) does perform well with TCTA. Both HILs perform well with the shallow HOMO HTL (NPB).

Example 5. Effect of Oxygen on HIL Work Function

To determine the effect of oxygen on the work function of HILs made from the inventive NQ inks, films were made using two different methods from another inventive NQ ink, designated NQ ink 6, which contains 5 wt % $MoO_3$ equivalent relative to the total weight of the other solids in the ink.

One method, designated Method 1, the NQ ink 6 was first deoxygenated and the film was formed by spin-coating under inert atmosphere. Then, on a hot plate, the film was flash annealed at 75° C. for 3 minutes under inert ($N_2$) atmosphere, and then finally annealed at 230° C. for 30 minutes under inert atmosphere.

In the second method, designated Method 2, the NQ ink 6 was prepared in air and the film was formed by spin-coating in air. Then, on a hot plate, the film was flash annealed at 75° C. for 3 minutes in air, and then finally annealed at 230° C. for 30 minutes under inert ($N_2$) atmosphere. The work functions of the resulting films were determined using the PESA-AC2 apparatus described herein and are summarized in Table 7.

TABLE 7

Effect of oxygen on work function of HILs made from NQ ink 6

| Method | Work function (eV) |
|---|---|
| Method 1 | 5.46 |
| Method 2 | 5.53 |

As seen in the results of Table 7, the presence or absence of oxygen in the ink before final annealing does not appreciably change the work function of resulting HIL.

This application claims priority to U.S. Provisional Application No. 62/280,759 filed on Jan. 20, 2016, the entire contents of which are incorporated by reference herein.

The invention claimed is:

1. A non-aqueous ink composition for use in preparing a hole carrying film which is a hole injection layer (HIL) or a hole transport layer (HTL) and not for use in preparing an emission layer (EML) comprising:

(a) a polythiophene comprising a repeating unit complying with formula (I)

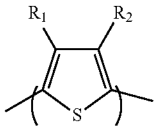

(I)

wherein $R_1$ and $R_2$ are each, independently, H, alkyl, fluoroalkyl, alkoxy, aryloxy, or $—O—[Z—O]_p—R_e$; wherein Z is an optionally halogenated hydrocarbylene group, p is equal to or greater than 1, and $R_e$ is H, alkyl, fluoroalkyl, or aryl;

(b) a transition metal complex having a ligand consisting essentially of one or more β-diketonate ligands, or consisting of one or more β-diketonate ligands and one or more ligands other than β-diketonate ligand, and the one or more ligands other than β-diketonate ligand are selected from the group consisting of inorganic ligands, cyanide (CN), carbonyl (CO), thiocyanato (SCN), aminoacids, iminoacetonates, ethylenediamines and amidinate; and (c) a liquid carrier comprising one or more organic solvents, and wherein the components of the composition including (a) the polythiophene, (b) the transition metal complex, and (c) the liquid carrier are selected to provide the hole carrying film which is a hole injection layer (HIL) or a hole transport layer (HTL) and not provide for the emission layer (EML).

2. The non-aqueous ink composition according to claim 1, wherein $R_1$ and $R_2$ are each, independently, H, fluoroalkyl, $—O[C(R_aR_b)—C(R_cR_d)—O]_p—R_e$, $—OR_f$;

wherein each occurrence of $R_a$, $R_b$, $R_c$, and $R_d$, is each, independently, H, halogen, alkyl, fluoroalkyl, or aryl;

$R_e$ is H, alkyl, fluoroalkyl, or aryl;

p is 1, 2, or 3; and $R_f$ is alkyl, fluoroalkyl, or aryl.

3. The non-aqueous ink composition according to claim 1, wherein $R_1$ is H and $R_2$ is other than H or wherein $R_1$ and $R_2$ are both other than H.

4. The non-aqueous ink composition according to claim 1, wherein the polythiophene comprises a repeating unit selected from the group consisting of

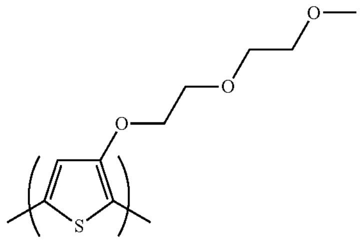

,

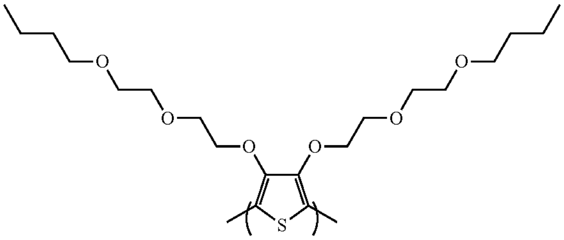

,

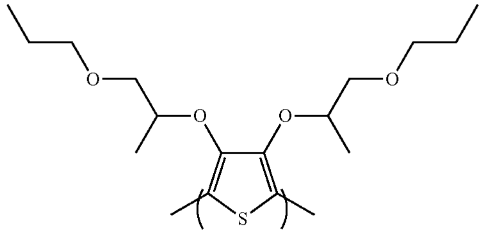

, and combinations thereof.

5. The non-aqueous ink composition according to claim 1, wherein the polythiophene is sulfonated.

6. The non-aqueous ink composition according to claim 1, wherein the polythiophene comprises repeating units complying with formula (I) in an amount of greater than 50% by weight, based on the total weight of the repeating units.

7. The non-aqueous ink composition according to claim 1, wherein the transition metal of the transition metal complex is rhenium, vanadium, molybdenum, and/or tungsten.

8. The non-aqueous ink composition according to claim 7, wherein the transition metal complex further comprises at least one oxo ligand.

9. The non-aqueous ink composition according to claim 1, wherein the liquid carrier comprises 1,3-butanediol, acetonitrile, ethylene glycol, 3-methoxypropionitrile, or a mixture thereof.

10. The non-aqueous ink composition according to claim 1, wherein the liquid carrier consists of (A) one or more glycol-based solvents.

11. The non-aqueous ink composition according to claim 10, wherein the glycol-based solvent (A) is a glycol ether, glycol monoether or glycol.

12. The non-aqueous ink composition according to claim 1, wherein the liquid carrier is a liquid carrier consisting essentially of (A) one or more glycol-based solvents and (B) one or more organic solvents other than the glycol-based solvents.

13. The non-aqueous ink composition according to claim 12, wherein the proportion by weight (wtA) of the glycol-based solvent (A) and the proportion by weight (wtB) of the organic solvent (B) satisfy the relationship represented by the following formula (1-1):

$$0.05 \leq wtB/(wtA+wtB) \leq 0.50 \quad (1\text{-}1).$$

14. The non-aqueous ink composition according to claim 1, further comprising metalloid nanoparticles.

15. The non-aqueous ink composition according to claim 1, further comprising a synthetic polymer comprising one or more acidic groups.

16. The non-aqueous ink composition according to claim 1, further comprising an amine compound.

17. A process for forming a hole-carrying film, the process comprising:

1) coating a substrate with the non-aqueous ink composition according to claim 1; and 2) annealing the coating on the substrate, thereby forming the hole-carrying film.

18. A device comprising the hole-carrying film formed by the process of claim 17, wherein the device is an OLED, OPV, transistor, capacitor, sensor, transducer, drug release device, electrochromic device, or battery device.

19. The non-aqueous ink composition according to claim 1, wherein the ligand consists of one or more β-diketone ligands and one or more ligands other than β-diketone ligand, and the one or more ligands other than β-diketonate ligand are selected from the group consisting of inorganic ligands, cyanide (CN), carbonyl (CO), thiocyanato (SCN), aminoacids, iminoacetonates, ethylenediamines and amidinate.

20. The non-aqueous ink composition according to claim 1, wherein the ligand consists of one or more β-diketonate ligands.

* * * * *